(12) United States Patent
I et al.

(10) Patent No.: US 12,456,988 B2
(45) Date of Patent: Oct. 28, 2025

(54) DITHERING TECHNIQUES FOR ANALOG-TO-DIGITAL CONVERTERS

(71) Applicant: Texas Instruments Incorporated, Dallas, TX (US)

(72) Inventors: Mishab I, Malappuram (IN); Himanshu Varshney, Bangalore (IN); Nagarajan Viswanathan, Bangalore (IN); Parth Sameer Kalgaonkar, Bangalore (IN); Sai Aditya Nurani, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 130 days.

(21) Appl. No.: 18/397,352

(22) Filed: Dec. 27, 2023

(65) Prior Publication Data

US 2025/0219652 A1 Jul. 3, 2025

(51) Int. Cl.
*H03M 1/20* (2006.01)
(52) U.S. Cl.
CPC .................................. *H03M 1/201* (2013.01)
(58) Field of Classification Search
CPC .................................................... H03M 1/201
See application file for complete search history.

(56) References Cited

U.S. PATENT DOCUMENTS

| | | | | |
|---|---|---|---|---|
| 9,158,137 | B1* | 10/2015 | Abbas | H04B 10/54 |
| 9,838,031 | B2* | 12/2017 | Dong | H03M 3/422 |
| 10,348,321 | B2* | 7/2019 | Robinson | H03M 1/60 |
| 11,121,718 | B1* | 9/2021 | Maurino | H03M 1/0626 |
| 2016/0373128 | A1* | 12/2016 | Wang | H03M 1/201 |
| 2017/0041013 | A1* | 2/2017 | Nagarajan | H03M 1/0641 |
| 2019/0280706 | A1* | 9/2019 | Bodnar | H03M 1/164 |
| 2021/0364375 | A1* | 11/2021 | Zamprogno | G01D 5/16 |

* cited by examiner

*Primary Examiner* — Mohamed Barakat
(74) *Attorney, Agent, or Firm* — Mandy Barsilai Fernandez; Frank D. Cimino

(57) ABSTRACT

An example analog-to-digital converter (ADC) includes first ADC circuitry, second ADC circuitry, and dither circuitry. The dither circuitry of the example ADC is to generate a first dither signal to produce a first dithered input signal at a first output coupled to an input of the first ADC circuitry, generate a second dither signal to produce a second dithered input signal at a second output coupled to an input of the second ADC circuitry, the first dither signal and the second dither signal to have opposite signs, and produce an output signal at a third output based on the first output of the first ADC circuitry and the second output of the second ADC circuitry.

25 Claims, 12 Drawing Sheets

DITHERING TECHNIQUES FOR ANALOG-TO-DIGITAL CONVERTERS

TECHNICAL FIELD

This description relates generally to analog-to-digital converters and, more particularly, to dithering techniques for analog-to-digital converters.

BACKGROUND

Analog-to-digital converters (ADCs) are devices, circuits, etc., that can be standalone or integrated in other devices, systems, etc., to convert analog input signals into digital output signals. For example, an analog input signal can be an analog voltage signal, an analog current signal, etc. An output digital signal can be a sequence of digital values or codes representative of values of the analog input signal at successive sample times based on a sampling rate of the ADC. In some ADCs, a dither signal is applied to the analog input signal to improve ADC performance.

SUMMARY

For methods and apparatus to implement dithering techniques for analog-to-digital converters, an example ADC includes first ADC circuitry having an input and an output, second ADC circuitry having an input and an output, and dither circuitry having a first input coupled to the output of the first ADC circuitry, having a second input coupled to the output of the second ADC circuitry, having a first output coupled to the input of the first ADC circuitry, having a second output coupled to the input of the second ADC circuitry, and having a third output. The dither circuitry is configured to generate a first dither signal to produce a first dithered input signal at the first output coupled to the input of the first ADC circuitry, generate a second dither signal to produce a second dithered input signal at the second output coupled to the input of the second ADC circuitry, the first dither signal and the second dither signal to have opposite signs, and produce an output signal at the third output based on the first output of the first ADC circuitry and the second output of the second ADC circuitry.

For methods and apparatus to implement dithering techniques for analog-to-digital converters, another example ADC includes first ADC circuitry having an input and an output, second ADC circuitry having an input and an output, and dither circuitry. The dither circuitry includes first circuitry configured to produce a first dithered input signal at a first output coupled to the input of the first ADC circuitry, and to produce second dithered input signal at a second output coupled to the input of the second ADC circuitry, the first dithered input signal based on a first dither signal, the second dithered input signal based on a second dither signal having an opposite sign relative to the first dither signal based on a condition. The dither circuitry includes second circuitry having a first input coupled to the output of the first ADC circuitry, having a second input coupled to the output of the second ADC circuitry, having a first output to provide an adjusted first output signal based on the output of the first ADC circuitry, and having a second output to provide an adjusted second output signal based on the output of the first ADC circuitry. The dither circuitry includes third circuitry having a first input coupled to the first output of the second circuitry, having a second input coupled to the second output of the second circuitry, and having an output, the third circuitry configured to provide one of the adjusted first output signal, the adjusted second output signal or a combination of the adjusted first output signal and the adjusted second output signal at the output of the third circuitry.

For methods and apparatus to implement dithering techniques for analog-to-digital converters, a further example ADC includes first ADC circuitry having an input and an output, second ADC circuitry having an input and an output, and dither circuitry. The dither circuitry includes first circuitry configured to produce a first dithered input signal at a first output coupled to the input of the first ADC circuitry, and to produce second dithered input signal at a second output coupled to the input of the second ADC circuitry, the first dithered input signal based on a first dither signal, the second dithered input signal based on a second dither signal having an opposite sign relative to the first dither signal based on a condition. The dither circuitry includes second circuitry having a first input coupled to the output of the first ADC circuitry, having a second input coupled to the output of the second ADC circuitry, having a first output to provide an adjusted first output signal based on the output of the first ADC circuitry, and having a second output to provide an adjusted second output signal based on the output of the first ADC circuitry. The dither circuitry includes third circuitry having a first input coupled to the first output of the second circuitry, having a second input coupled to the second output of the second circuitry, and having an output, the third circuitry configured to provide a weighted combination of the adjusted first output signal and the adjusted second output signal at the output of the third circuitry.

For methods and apparatus to implement dithering techniques for analog-to-digital converters, yet another example ADC includes first ADC circuitry having an input and an output, second ADC circuitry having an input and an output, and dither circuitry. The dither circuitry includes first circuitry having a first output, a second output, and an input, the first circuitry configured to provide a first dither signal at the first output and to provide a second dither signal at the second output, the first circuitry configured to generate the first dither signal and the second dither signal to have opposite signs based on a plurality of magnitude signals and a plurality of digital sequences. The dither circuitry includes second circuitry having a first input coupled to the first output of the first circuitry, and having a second input coupled to the second output of the first circuitry, the second circuitry configured to produce a first dithered input signal at a first output coupled to the input of the first ADC circuitry, and to produce second dithered input signal at a second output coupled to the input of the second ADC circuitry, the first dithered input signal based on the first dither signal, the second dithered input signal based on the second dither signal. The dither circuitry includes third circuitry having an input, and having an output coupled to the input of the first circuitry, the third circuitry configured to determine a control signal based on a signal applied to the input, the third circuitry configured to output the control signal at the output, wherein the first circuitry is configured to set one or more values of the plurality of digital sequences based on the control signal.

BRIEF DESCRIPTION OF THE DRAWINGS

In general, the same reference numbers will be used throughout the drawing(s) and accompanying written description to refer to the same or like parts. The figures are not necessarily to scale.

DETAILED DESCRIPTION

Figure 1:
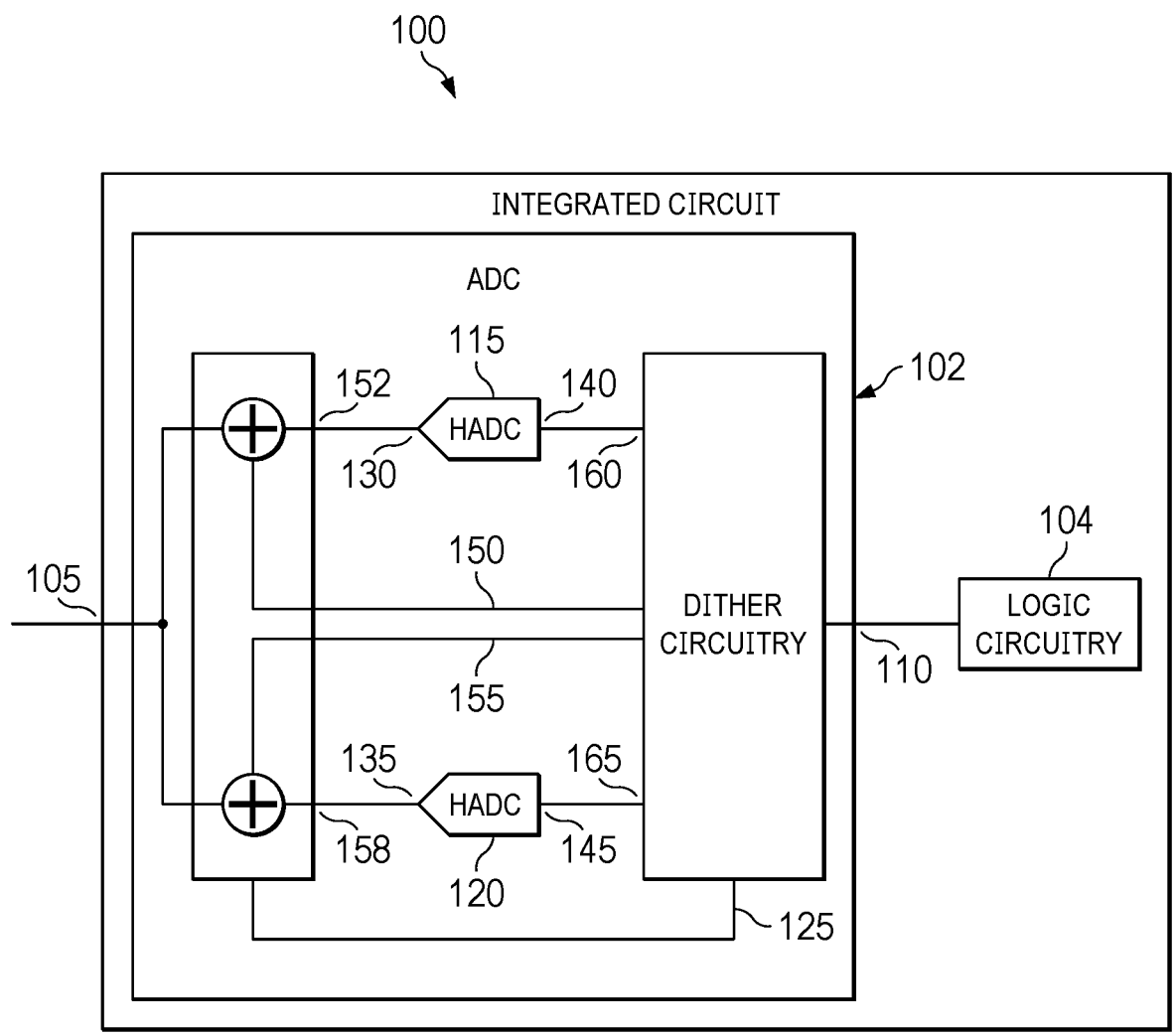
FIG. 1 is a block diagram of an example integrated circuit including an example ADC designed to implement example dithering techniques based on teachings of this description.

As described above, a dither signal may be applied (e.g., added) to the input signal of an ADC to improve ADC performance. In some examples, the dither signal is a noise or pseudo-noise signal constrained to be within a fraction of the full-range of the ADC. The dither signal is added to the ADC input and then subtracted from the ADC output. Adding such a dither signal to the ADC input can randomize the quantization error of the ADC and improve the higher-order harmonics of the ADC.

However, some ADCs, such as delay domain ADCs, have a nonlinearity profile that calls for a relatively large, multibit dither signal to reduce the higher-order harmonics and linearize the ADC. For example, a 13-bit delay domain ADC that has a full scale output code range of ±4095 might utilize a dither signal having a corresponding code range of ±1023. To avoid saturation at the ADC output and the associated output signal distortion, such an ADC might constrain the ADC input to accept an input signal having a corresponding code range of ±3072, which results in a signal-to-noise ratio (SNR) loss of 2.4 decibels (dB). However, ADCs implementing example dither techniques as described herein can accept input signals corresponding to the full code range of the ADC (or close to the full code range of the ADC), thereby recovering some or all of the SNR that could have been lost due to dither.

As described in further detail below, example ADCs that implement example dithering techniques as described herein include first ADC circuitry and second ADC circuitry to perform analog-to-digital conversion in parallel on two different dithered input signals produced by applying two different dither signals to the input of the ADC. In example dithering techniques described herein, the two dither signals are generated to have opposite signs and, thus, are correlated, unlike in other techniques. Because the two dither signals have opposite signs, the output signal of at least one of the first ADC circuitry or the second ADC circuitry will not be saturated (at least under one or more conditions described in further detail below). Example dithering techniques described herein produce an output signal of the ADC based on the output signals of the first ADC circuitry and the second ADC circuitry in a manner that reduces or eliminates the contribution by a saturated output signal of the first ADC circuitry or the second ADC circuitry.

For example, if a large positive input analog signal near the full range of the ADC is applied to input of the ADC, and the dither signal used to produce the dithered input signal to be applied to the first ADC circuitry has a positive sign, then that dithered input signal may exceed the full range of the ADC resulting in saturation at the output of the first ADC circuitry. However, the dither signal used to produce the dithered input signal to be applied to the second ADC circuitry will have (at least under one or more conditions described in further detail below) a negative sign (because the two dither signals are generated to have opposite signs). Thus, that dithered input signal applied to the second ADC circuitry will be within the full range of the ADC and result in no saturation at the output of the second ADC circuitry.

In some dither techniques described herein, saturation detection is utilized to detect that, in the foregoing example, the output of the first ADC circuitry is saturated and, thus, the output signal of the ADC is produced based on the output of the second ADC circuitry with no contribution from the first ADC circuitry. Otherwise, if neither the first ADC circuitry nor the second ADC circuitry is saturated, the output signal of the ADC is produced based on the average of the output signals of both the first ADC circuitry and the second ADC circuitry. In some dither techniques described herein, a weighted averaging of the output signals of both the first ADC circuitry and the second ADC circuitry is utilized such that a saturated output of the first ADC circuitry or the second ADC circuitry is deemphasized in the averaging, and unsaturated outputs are emphasized in the averaging. In some dither techniques described herein, saturation detection may be used to adjust the dither signals applied to the input of the ADC to reduce the possibility of saturation of the first ADC circuitry or the second ADC circuitry.

Turning to the figures, FIG. 1 is a block diagram of an example integrated circuit 100 that includes an example ADC 102 and example logic circuitry 104. The example ADC 102 of FIG. 1 implements dithering based on teachings of this description. The example ADC 102 has an example ADC input 105 and an example ADC output 110, and includes first example ADC circuitry 115, second example ADC circuitry 120 and example dither circuitry 125. The ADC input 105 accepts an analog input signal applied to the integrated circuit 100, such as an analog voltage signal, an analog current signal, etc. The ADC output 110 provides an output digital signal that is a sequence of digital values, or digital codes, representative of values the analog input signal at successive sample times based on a sampling rate of the ADC 102.

In the illustrated example of FIG. 1, the ADC circuitry 115 has an input 130 and an output 140. Likewise, the ADC circuitry 120 has an input 135 and an output 145. The ADC circuitry 115 and the ADC circuitry 120 are designed to each support the full-range of the ADC 102. For example, if the ADC 102 is a 13-bit ADC that supports a full scale output code range of ±4095, then both the ADC circuitry 115 and the ADC circuitry 120 are designed to be 13-bit ADCs that support a full scale output code range of ±4095. However, the performance targets for the ADC circuitry 115 and the ADC circuitry 120 can be less stringent than the performance target of the ADC 102. For example, if the ADC 102 is to meet a particular SNR target, then the ADC circuitry 115 and the ADC circuitry 120 can be designed to meet a less stringent SNR target that is 3 dB (or some other value) lower than the particular SNR target of the ADC 102. As such, in some examples, the ADC circuitry 115 and the ADC circuitry 120 are referred to half ADC circuitry, half ADCs, etc.

In the illustrated example of FIG. 1, the dither circuitry 125 of the ADC 102 generates and provides a first dither signal 150 at the input 130 of the ADC circuitry 115. The dither circuitry 125 uses the first dither signal 150 to modify the ADC input 105 to produce a first dithered input signal at a first output 152 coupled to the input 130 of the ADC circuitry 115. The dither circuitry 125 also generates and provides a second dither signal 155 at the input 135 of the ADC circuitry 120. The dither circuitry 125 uses the second dither signal 155 to modify the ADC input 105 to produce a second dithered input signal at a second output 158 coupled to the input 135 of the ADC circuitry 120. As described above, the dither circuitry 125 generates the first dither signal 150 and the second dither signal 155 to have opposite signs (at least under one or more conditions described in further detail below) such that when the first dither signal is positive, the second dither signal is negative, and vice versa. As such, the first dither signal and the second dither signal generated by the dither circuitry 125 are correlated (at least under one or more conditions described in further detail below).

The dither circuitry 125 also has a first input 160 to couple to the output 140 of the ADC circuitry 115, and a second input 165 to couple to the output 145 of the ADC circuitry 120. The dither circuitry 125 operates to produce an output signal at the ADC output 110 based on the output 140 of the ADC circuitry 115 and the output 145 of the ADC circuitry 120. Example implementations of the dither circuitry 125 are described in further detail below.

In the illustrated example of FIG. 1, the logic circuitry 104 operates on the output signal provided at the ADC output 110 of the ADC 102. The logic circuitry 104 can be implemented by any logic circuitry or combination of logic circuitry. For example, the logic circuitry can include programmable processor circuitry such as one or more programmable processor, central processing units (CPUs), graphical processing units (GPUs), application specific integrated circuits (ASICs), field programmable gate arrays (FPGAs), etc.

In the illustrated example of FIG. 1, the ADC 102 is included in the integrated circuit 100. However, in other examples, the ADC 102 can be implemented as a stand-alone device, integrated circuit, etc.

Figure 2:
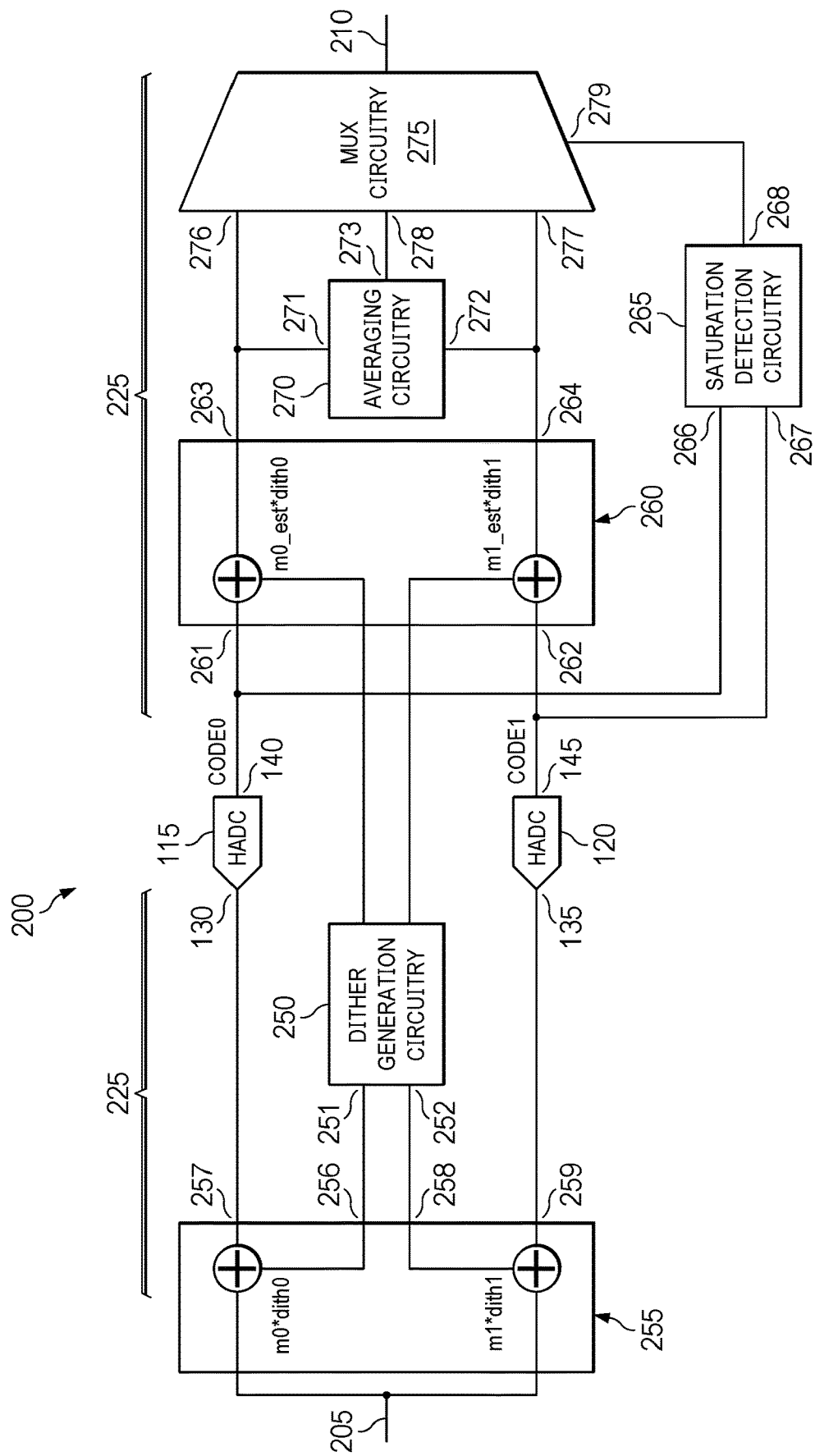
FIG. 2 is a block diagram of a first example implementation of the ADC of FIG. 1.

FIG. 2 is a block diagram of an example ADC 200 that corresponds to a first example implementation of the ADC 102 of FIG. 1. The ADC 200 is designed to implement a first example dithering technique based on teachings of this description. The ADC 200 of FIG. 2 may be instantiated (e.g., creating an instance of, bring into being for any length of time, materialize, implement, etc.) by programmable circuitry such as a Central Processor Unit (CPU) executing first instructions. Also, the ADC 200 of FIG. 2 may be instantiated (e.g., creating an instance of, bring into being for any length of time, materialize, implement, etc.) by (i) an Application Specific Integrated Circuit (ASIC) and/or (ii) a Field Programmable Gate Array (FPGA) structured and/or configured in response to execution of second instructions to perform operations corresponding to the first instructions. Some or all of the circuitry of FIG. 2 may, thus, be instantiated at the same or different times. Some or all of the circuitry of FIG. 2 may be instantiated, for example, in one or more threads executing concurrently on hardware and/or in series on hardware. Moreover, in some examples, some or all of the circuitry of FIG. 2 may be implemented by microprocessor circuitry executing instructions and/or FPGA circuitry performing operations to implement one or more virtual machines and/or containers.

The example ADC 200 of FIG. 2 has an example ADC input 205 and an example ADC output 210 that correspond respectively to the example ADC input 105 and the example ADC output 110 described above in connection with FIG. 1. As such, the ADC input 205 accepts an analog input signal, such as an analog voltage signal, an analog current signal, etc. The ADC output 210 provides an output digital signal that is a sequence of digital values, or digital codes, representative of values the analog input signal at successive sample times based on a sampling rate of the ADC.

The example ADC 200 of FIG. 2 also includes the first example ADC circuitry 115 and the second example ADC circuitry 120 described above in connection with FIG. 1. As such, descriptions of the first example ADC circuitry 115 and the second example ADC circuitry 120 are provided above in connection with the discussion of FIG. 1 and, in the interest of brevity, are not reproduced in the discussion of FIG. 2.

The example ADC 200 of FIG. 2 further includes example dither circuitry 225 that corresponds to a first example implementation of the dither circuitry 125 of FIG. 1. In the illustrated example of FIG. 2, the dither circuitry 225 includes example dither generation circuitry 250, example dither application circuitry 255, example dither removal circuitry 260, example saturation detection circuitry 265, example averaging circuitry 270 and example multiplexer circuitry 275. The dither generation circuitry 250 of the illustrated example generates a first dither signal and provides the first dither signal via a first output 251. The first dither signal is used to modify the ADC input 205 to produce a first dithered input signal to apply to the input 130 of the ADC circuitry 115. The dither generation circuitry 250 also generates a second dither signal and provides the second dither signal via a second output 252. The second dither signal is used to modify the ADC input 205 to produce a second dithered input signal to apply to the input 135 of the ADC circuitry 120. As described above, the dither generation circuitry 250 generates the first dither signal and the second dither signal to have opposite signs (at least under one or more conditions described in further detail below) such that when the first dither signal is positive the second dither signal is negative, and vice versa. As such, the first dither signal and the second dither signal generated by the dither generation circuitry 250 are correlated (at least under one or more conditions described in further detail below).

In some examples, the dither generation circuitry 250 generates the first dither signal based on a first magnitude signal (illustrated as "m0" in FIG. 2) and a first digital sequence (illustrated as "dith0" in FIG. 2), and generates the second dither signal based on a second magnitude signal (illustrated as "m1" in FIG. 2) and a second digital sequence (illustrated as "dith1" in FIG. 2). For example, the dither generation circuitry 250 of FIG. 2 multiplies the first magnitude signal (m0) and the first digital sequence (dith0) to generate the first dither signal (illustrated as "m0*dith0" in FIG. 2), and multiplies the second magnitude signal (m1) and the second digital sequence (dith1) to generate the second dither signal (illustrated as "m1*dith1" in FIG. 2). In some examples, the dither generation circuitry 250 includes circuitry to generate the first magnitude signal (m0) and the second magnitude signal (m1) as time-varying analog signals that may be similar but not necessarily identical to each other. In some such examples, the dither generation circuitry 250 also includes a sequence generator, such as a pseudo-random noise generator, to generate the first digital sequence (dith0) and the second digital sequence (dith1).

Furthermore, the dither generation circuitry 250 of the illustrated example generates the first digital sequence (dith0) to be the negative of the second digital sequence (dith1) (at least under one or more conditions described in further detail below) (e.g., dith1=−dith0). In other words, the dither generation circuitry 250 of the illustrated example generates the values of the first digital sequence (dith0) to be the negatives of the values of the second digital sequence (dith1) (at least under one or more conditions described in further detail below). For example, the dither generation circuitry 250 may generate the first digital sequence (dith0) and the second digital sequence (dith1) to have values in the range of [−3.5, 3.5]. In such an example, if the first digital sequence (dith0) generated by the dither generation circuitry 250 is dith0=( . . . , −1.5, 2.5, 1.5, −3.5, . . . ) then the second digital sequence (dith1) generated by the dither generation circuitry 250 is the negative of the first digital sequence (dith0) such that dith1=( . . . , 1.5, −2.5, −1.5, 3.5, . . . ) (at least under one or more conditions described in further detail below). Operation of the dither generation circuitry 250 is described in further detail below.

In some examples, the ADC 200 includes means for generating dither signals. For example, the means for generating dither signals may be implemented by the dither generation circuitry 250. In some examples, the dither generation circuitry 250 may be instantiated by programmable circuitry such as the example programmable circuitry 1012 of FIG. 10. For instance, the dither generation circuitry 250 may be instantiated by the example microprocessor 1100 of FIG. 11 executing machine executable instructions such as those implemented by at least blocks 705-715 of FIG. 7 and 805-815 of FIG. 8. In some examples, the dither generation circuitry 250 may be instantiated by hardware logic circuitry, which may be implemented by an ASIC, XPU, or the FPGA circuitry 1200 of FIG. 12 configured and/or structured to perform operations corresponding to the machine readable instructions. Also, the dither generation circuitry 250 may be instantiated by any other combination of hardware, software, and/or firmware. For example, the dither generation circuitry 250 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

The dither application circuitry 255 of the illustrated example is at the input 130 of the ADC circuitry 115 and the input 135 of the ADC circuitry 120. The dither application circuitry 255 has a first input 256 coupled to the first output 251 of the dither generation circuitry 250 to accept the first dither signal. The dither application circuitry 255 uses the first dither signal (m0*dith0) to modify the ADC input 205 to produce, at a first output 257 coupled to the input 130 of the ADC circuitry 115, the first dithered input signal that is applied to the input 130 of the ADC circuitry 115. For example, in FIG. 2, the dither application circuitry 255 adds the first dither signal (m0*dith0) to the input signal at the ADC input 205 to produce the first dithered input signal that is applied to the input 130 of the ADC circuitry 115. Likewise, the dither application circuitry 255 of the illustrated example has a second input 258 coupled to the second output 252 of the dither generation circuitry 250 to accept the second dither signal. The dither application circuitry 255 uses the second dither signal (m1*dith1) to modify the ADC input 205 to produce, at a second output 259 coupled to the second input 1440 of the ADC circuitry 120, the second dithered input signal that is applied to the input 135 of the ADC circuitry 120. For example, in FIG. 2, the dither application circuitry 255 adds the second dither signal (m1*dith1) to the input signal at the ADC input 205 to produce the second dithered input signal that is applied to the input 135 of the ADC circuitry 120.

In some examples, the ADC 200 includes means for applying dither signals to an input signal. For example, the means for applying dither signals may be implemented by the dither application circuitry 255. In some examples, the dither application circuitry 255 may be instantiated by programmable circuitry such as the example programmable circuitry 1012 of FIG. 10. For instance, the dither application circuitry 255 may be instantiated by the example microprocessor 1100 of FIG. 11 executing machine executable instructions such as those implemented by at least blocks 720 of FIG. 7, 820 of FIG. 8 and 910 of FIG. 9. In some examples, the dither application circuitry 255 may be instantiated by hardware logic circuitry, which may be implemented by an ASIC, XPU, or the FPGA circuitry 1200 of FIG. 12 configured and/or structured to perform operations corresponding to the machine readable instructions. Also, the dither application circuitry 255 may be instantiated by any other combination of hardware, software, and/or firmware. For example, the dither application circuitry 255 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In the illustrated example of FIG. 2, the dither removal circuitry 260, the saturation detection circuitry 265, the averaging circuitry 270 and the multiplexer circuitry 275 operate to produce an output signal at the ADC output 210 based on the output 140 of the ADC circuitry 115 and the output 145 of the ADC circuitry 120. The dither removal circuitry 260 of the illustrated example has a first input 261 that is coupled to the output 140 of the ADC circuitry 115, and has a second input 262 that is coupled to the output 145 of the ADC circuitry 120. The dither removal circuitry 260 adjusts the output 140 of the ADC circuitry 115 to remove (or reduce) the effects of the first dither signal at the input 130 of the ADC circuitry 115. Likewise, the dither removal circuitry 260 of the illustrated example adjusts the output 145 of the ADC circuitry 120 to remove (or reduce) the effects of the second dither signal at the input 135 of the ADC circuitry 120.

As described above, in the example of FIG. 2, the first dither signal (m0*dith0) is the product of the first magnitude signal (m0) and the first digital sequence (dith0), and the second dither signal (m1*dith1) is the product of the second magnitude signal (m1) and the second digital sequence (dith1). As such, in FIG. 2, the dither removal circuitry 260 provides, via a first output 263, an adjusted first output signal based on the output 140 of the ADC circuitry 115, the first digital sequence (dith0) and an estimate of the first magnitude signal (illustrated as "m0_est" in FIG. 2). For example, the dither removal circuitry 260 subtracts a product of the first digital sequence (dith0) and the estimate of the first magnitude signal (m0_est) from the digital output signal or code (illustrated as "code0" in FIG. 2) at the first output 135 of the ADC circuitry 115 to determine the adjusted first output signal associated with the ADC circuitry 115. Because the first dither signal (m0*dith0) is the product of the first magnitude signal (m0) and the first digital sequence (dith0), the product of the first digital sequence (dith0) and the estimate of the first magnitude signal (m0_est) is an estimate of first dither signal. Thus, subtracting that estimate of the first dither signal at the output 140 of the ADC circuitry 115 removes (or reduces) the effect of applying the first dither signal at the input 130 of the ADC circuitry 115.

Likewise, in the example of FIG. 2, the dither removal circuitry 260 provides, via a second output 264, an adjusted second output signal based on the output 145 of the ADC circuitry 120, the second digital sequence (dith1) and an estimate of the second magnitude signal (illustrated as "m1_est" in FIG. 2). For example, the dither removal circuitry 260 subtracts a product of the second digital sequence (dith1) and the estimate of the second magnitude signal (m1_est) from the digital output signal or code (illustrated as "code1" in FIG. 2) at the output 145 of the ADC circuitry 120 to determine the adjusted second output signal associated with the ADC circuitry 120. Because the second dither signal (m1*dith1) is the product of the second magnitude signal (m1) and the second digital sequence (dith1), the product of the second digital sequence (dith1) and the estimate of the second magnitude signal (m1_est) is an estimate of second dither signal. Thus, subtracting that estimate of the second dither signal at the output 145 of the ADC circuitry 120 removes (or reduces) the effects of applying the second dither signal at the input 135 of the ADC circuitry 120. Operation of the dither removal circuitry 260 to determine the estimate (m0_est) of the first magnitude signal (m0) and the estimate (m1_est) of the second magnitude signal (m1) is described in further detail below.

In some examples, the ADC 200 includes means for removing dither signal effects. For example, the means for removing dither signal effects may be implemented by the dither removal circuitry 260. In some examples, the dither removal circuitry 260 may be instantiated by programmable circuitry such as the example programmable circuitry 1012 of FIG. 10. For instance, the dither removal circuitry 260 may be instantiated by the example microprocessor 1100 of FIG. 11 executing machine executable instructions such as those implemented by at least blocks 725 and 730 of FIGS. 7 and 825 and 830 of FIG. 8. In some examples, the dither removal circuitry 260 may be instantiated by hardware logic circuitry, which may be implemented by an ASIC, XPU, or the FPGA circuitry 1200 of FIG. 12 configured and/or structured to perform operations corresponding to the machine readable instructions. Also, the dither removal circuitry 260 may be instantiated by any other combination of hardware, software, and/or firmware. For example, the dither removal circuitry 260 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In the illustrated example of FIG. 2, the saturation detection circuitry 265 has a first input 266 coupled to the first output 263 of the dither removal circuitry 260, and has a second input 267 coupled to the second output 264 of the dither removal circuitry 260. The saturation detection circuitry 265 has an output 268 that provides a control signal indicating whether the output 140 of the ADC circuitry 115 or the output 145 of the second ADC circuitry is saturated. In some examples, the saturation detection circuitry 265 compares the output signal/code (code0) at the output 140 of the ADC circuitry 115 to one or more thresholds to detect whether the output 140 of the ADC circuitry 115 is saturated. Likewise, the saturation detection circuitry 265 compares the output signal/code (code1) at the output 145 of the ADC circuitry 120 to one or more thresholds to detect whether the output 145 of the ADC circuitry 120 is saturated.

For example, the one or more thresholds can correspond to the maximum and minimum codewords supported by the ADC circuitry 115 and the output 145 of the second ADC circuitry (e.g., such as ±4095 corresponding to 13-bit codewords). In some such examples, the saturation detection circuitry 265 detects the output 140 of the ADC circuitry 115 is saturated when the output signal/code (code0) at the output 140 corresponds to the maximum codeword or the minimum codeword supported by the ADC circuitry 115. Likewise, in such an examples, the saturation detection circuitry 265 detects the output 145 of the ADC circuitry 120 is saturated when the output signal/code (code1) at the output 145 corresponds to the maximum codeword or the minimum codeword supported by the ADC circuitry 120. As noted above, because the first and second dither signals have opposite signs (at least under one or more conditions described in further detail below), at least one of the output 140 of the ADC circuitry 115 or the output 145 of the ADC circuitry 120 will not be saturated (at least under those one or more conditions).

In some examples, the ADC 200 includes means for detecting saturation. For example, the means for detecting saturation may be implemented by the saturation detection circuitry 265. In some examples, the saturation detection circuitry 265 may be instantiated by programmable circuitry such as the example programmable circuitry 1012 of FIG. 10. For instance, the saturation detection circuitry 265 may be instantiated by the example microprocessor 1100 of FIG. 11 executing machine executable instructions such as those implemented by at least blocks 735 of FIG. 7, 835 of FIG. 8 and 925 of FIG. 9. In some examples, the saturation detection circuitry 265 may be instantiated by hardware logic circuitry, which may be implemented by an ASIC, XPU, or the FPGA circuitry 1200 of FIG. 12 configured and/or structured to perform operations corresponding to the machine readable instructions. Also, the saturation detection circuitry 265 may be instantiated by any other combination of hardware, software, and/or firmware. For example, the saturation detection circuitry 265 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In the illustrated example of FIG. 2, the averaging circuitry 270 has a first input 271 coupled to the first output 263 of the dither removal circuitry 260, and has a second input 272 coupled to the second output 264 of the dither removal circuitry 260. The averaging circuitry 270 of the illustrated example combines the adjusted first output signal associated with the ADC circuitry 115 and the adjusted second output signal associated with the ADC circuitry 120. For example, in FIG. 2, the averaging circuitry 270 averages the adjusted first output signal associated with the ADC circuitry 115 and the adjusted second output signal associated with the ADC circuitry 120 to produce an averaged output signal at an output 273 of the averaging circuitry 270.

In some examples, the ADC 200 includes means for signal averaging. For example, the means for signal averaging may be implemented by the averaging circuitry 270. In some examples, the averaging circuitry 270 may be instantiated by programmable circuitry such as the example programmable circuitry 1012 of FIG. 10. For instance, the averaging circuitry 270 may be instantiated by the example microprocessor 1100 of FIG. 11 executing machine executable instructions such as those implemented by at least blocks 740 of FIG. 7 and 940 of FIG. 9. In some examples, the averaging circuitry 270 may be instantiated by hardware logic circuitry, which may be implemented by an ASIC, XPU, or the FPGA circuitry 1200 of FIG. 12 configured and/or structured to perform operations corresponding to the machine readable instructions. Also, the averaging circuitry 270 may be instantiated by any other combination of hardware, software, and/or firmware. For example, the averaging circuitry 270 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In the illustrated example of FIG. 2, the multiplexer circuitry 275 has a first input 276 coupled to the first output 263 of the dither removal circuitry 260, has a second input 277 coupled to the second output 264 of the dither removal circuitry 260, has a third input 278 coupled to the output 273 of the averaging circuitry 270, and has a fourth (control) input 279 coupled to the output 268 of the saturation detection circuitry 265. The multiplexer circuitry 275 of the illustrated example selects one of the averaged output signal from the averaging circuitry 270, the adjusted first output signal associated with the ADC circuitry 115 or the adjusted second output signal associated with the ADC circuitry 120 to be the output signal at the ADC output 210. In the illustrated example of FIG. 2, the multiplexer circuitry 275 determines the selection based on the output 268 of the saturation detection circuitry 265. For example, the multiplexer circuitry 275 sets the output signal at the ADC output 210 to be the averaged output signal from the averaging circuitry 270 when the saturation detection circuitry 265 detects that neither the output 140 of the ADC circuitry 115 nor the output 145 of the ADC circuitry 120 is saturated. However, in this example, the multiplexer circuitry 275 sets the output signal at the ADC output 210 to be the adjusted first output signal associated with the ADC circuitry 115 when the saturation detection circuitry 265 detects that the output 145 of the ADC circuitry 120 is saturated. Similarly, in this example, the multiplexer circuitry 275 sets the output signal at the ADC output 210 to be the adjusted second output signal associated with the ADC circuitry 120 when the saturation detection circuitry 265 detects that the output 140 of the ADC circuitry 115 is saturated. Mathematically, the output signal at the ADC output 210 is given by Equation 1, which is:

$$ADC_{output} = \begin{cases} code1 - m1_{est} * dith1, & \text{if } code0 \text{ is saturated} \\ code0 - m0_{est} * dith0, & \text{if } code1 \text{ is saturated} \\ \frac{1}{2}[(code0 - m0_{est} * dith0) + (code1 - m1_{est} * dith1)], & \text{otherwise} \end{cases} \quad (1)$$

In some examples, the ADC 200 includes means for signal multiplexing. For example, the means for signal multiplexing may be implemented by the multiplexer circuitry 275. In some examples, the multiplexer circuitry 275 may be instantiated by programmable circuitry such as the example programmable circuitry 1012 of FIG. 10. For instance, the multiplexer circuitry 275 may be instantiated by the example microprocessor 1100 of FIG. 11 executing machine executable instructions such as those implemented by at least blocks 740 of FIG. 7 and 940 of FIG. 9. In some examples, the multiplexer circuitry 275 may be instantiated by hardware logic circuitry, which may be implemented by an ASIC, XPU, or the FPGA circuitry 1200 of FIG. 12 configured and/or structured to perform operations corresponding to the machine readable instructions. Also, the multiplexer circuitry 275 may be instantiated by any other combination of hardware, software, and/or firmware. For example, the multiplexer circuitry 275 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

Figure 3:
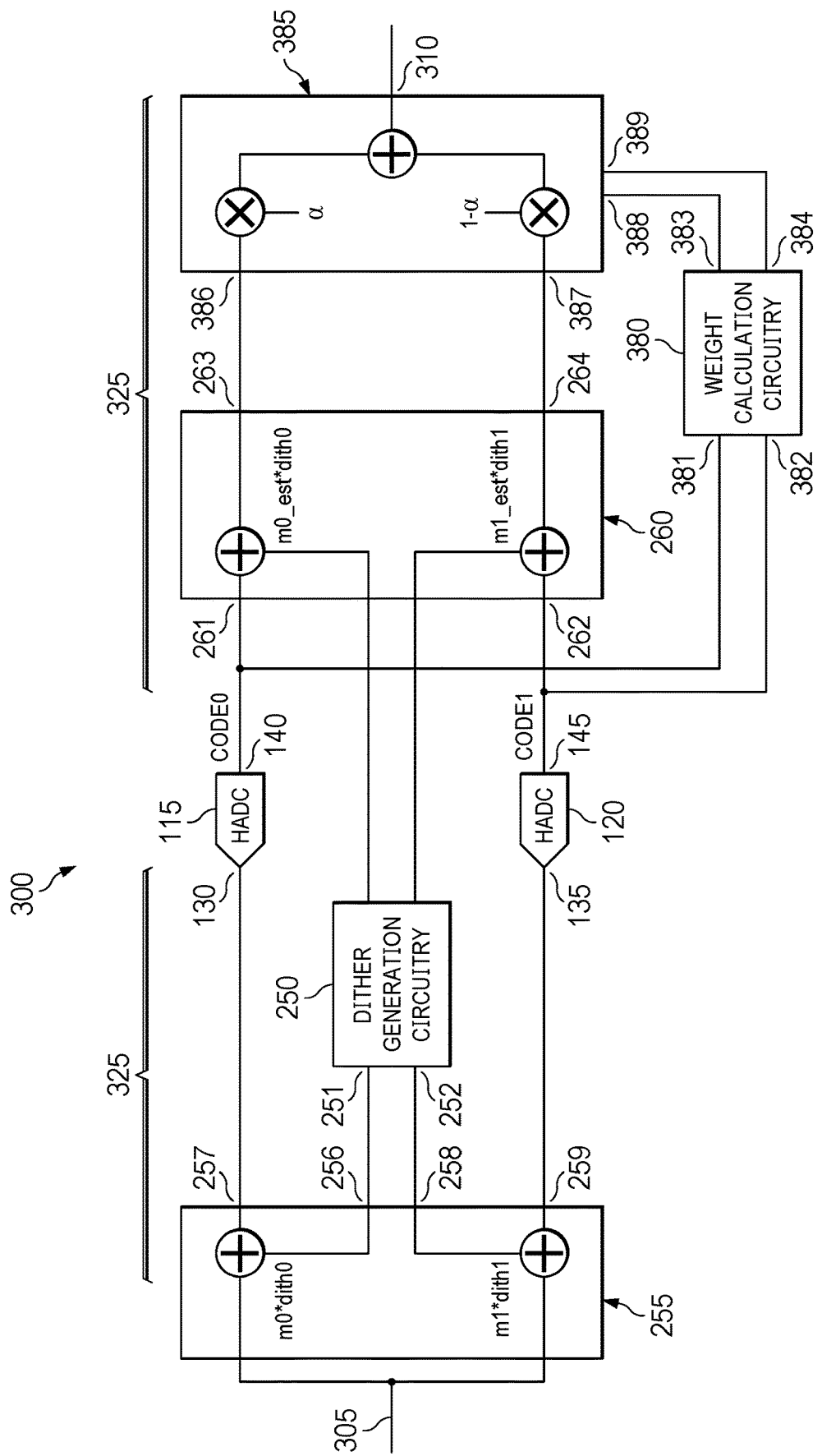
FIG. 3 is a block diagram of a second example implementation of the ADC of FIG. 1.

FIG. 3 is a block diagram of an example ADC 300 that corresponds to a second example implementation of the ADC 102 of FIG. 1. The ADC 300 is designed to implement a second example dithering technique based on teachings of this description. The ADC 300 of FIG. 3 may be instantiated (e.g., creating an instance of, bring into being for any length of time, materialize, implement, etc.) by programmable circuitry such as a Central Processor Unit (CPU) executing first instructions. Also, the ADC 300 of FIG. 3 may be instantiated (e.g., creating an instance of, bring into being for any length of time, materialize, implement, etc.) by (i) an Application Specific Integrated Circuit (ASIC) and/or (ii) a Field Programmable Gate Array (FPGA) structured and/or configured in response to execution of second instructions to perform operations corresponding to the first instructions. Some or all of the circuitry of FIG. 3 may, thus, be instantiated at the same or different times. Some or all of the circuitry of FIG. 3 may be instantiated, for example, in one or more threads executing concurrently on hardware and/or in series on hardware. Moreover, in some examples, some or all of the circuitry of FIG. 3 may be implemented by microprocessor circuitry executing instructions and/or FPGA circuitry performing operations to implement one or more virtual machines and/or containers.

The example ADC 300 of FIG. 3 has an example ADC input 305 and an example ADC output 310 that correspond respectively to the example ADC input 105 and the example ADC output 110 described above in connection with FIG. 1.

As such, the ADC input 305 accepts an analog input signal, such as an analog voltage signal, an analog current signal, etc. The ADC output 310 provides an output digital signal that is a sequence of digital values, or digital codes, representative of values the analog input signal at successive sample times based on a sampling rate of the ADC.

The example ADC 300 of FIG. 3 also includes the first example ADC circuitry 115 and the second example ADC circuitry 120 described above in connection with FIG. 1. As such, descriptions of the first example ADC circuitry 115 and the second example ADC circuitry 120 are provided above in connection with the discussion of FIG. 1 and, in the interest of brevity, are not reproduced in the discussion of FIG. 3.

The example ADC 300 of FIG. 3 further includes example dither circuitry 325 that corresponds to a second example implementation of the dither circuitry 125 of FIG. 1. In the illustrated example of FIG. 3, the dither circuitry 325 includes the dither generation circuitry 250, the dither application circuitry 255 and the dither removal circuitry 260 described above in connection with FIG. 2. As such, descriptions of the dither generation circuitry 250, the dither application circuitry 255 and the dither removal circuitry 260 are provided above in connection with the discussion of FIG. 2 and, in the interest of brevity, are not reproduced in the discussion of FIG. 3.

In the illustrated example of FIG. 3, the dither circuitry 325 also includes example weight calculation circuitry 380 and example weighted averaging circuitry 385 that replace the saturation detection circuitry 265, the averaging circuitry 270 and the multiplexer circuitry 275 included in the dither circuitry 225 of the ADC 200 of FIG. 2. In the example ADC 200 of FIG. 2, the switching by the multiplexer circuitry 275 among the averaged output signal from the averaging circuitry 270, the adjusted first output signal associated with the ADC circuitry 115 and the adjusted second output signal associated with the ADC circuitry 120 can introduce discontinuities and, thus, higher-order harmonics in the output signal at the ADC output 210. In contrast, the weight calculation circuitry 380 and the weighted averaging circuitry 385 of the dither circuitry 325 of FIG. 3 determine the output signal at the ADC output 310 based on a weighted combination of the adjusted first output signal associated with the ADC circuitry 115 and the adjusted second output signal associated with the ADC circuitry 120 without any switching discontinuities.

In the illustrated example of FIG. 3, the weight calculation circuitry 380 has a first input 381 coupled to the output 140 of the ADC circuitry 115, and has a second input 382 coupled to the output 145 of the second ADC circuitry. The weight calculation circuitry 380 of the illustrated examples calculates weights to apply to the adjusted first output signal associated with the ADC circuitry 115 and the adjusted second output signal associated with the ADC circuitry 120 based on a trapezoidal function applied to the output values/codes at the output 140 of the ADC circuitry 115 and at the output 145 of the ADC circuitry 120. For example, the weight calculation circuitry 380 has a first output 383 to provide a first weight (illustrated as "α" in FIG. 3) to apply to the adjusted first output signal associated with the ADC circuitry 115, and has a second output 384 to provide a second weight (illustrated as "1−α" in FIG. 3) to apply to the adjusted second output signal associated with the ADC circuitry 120.

Figure 4:
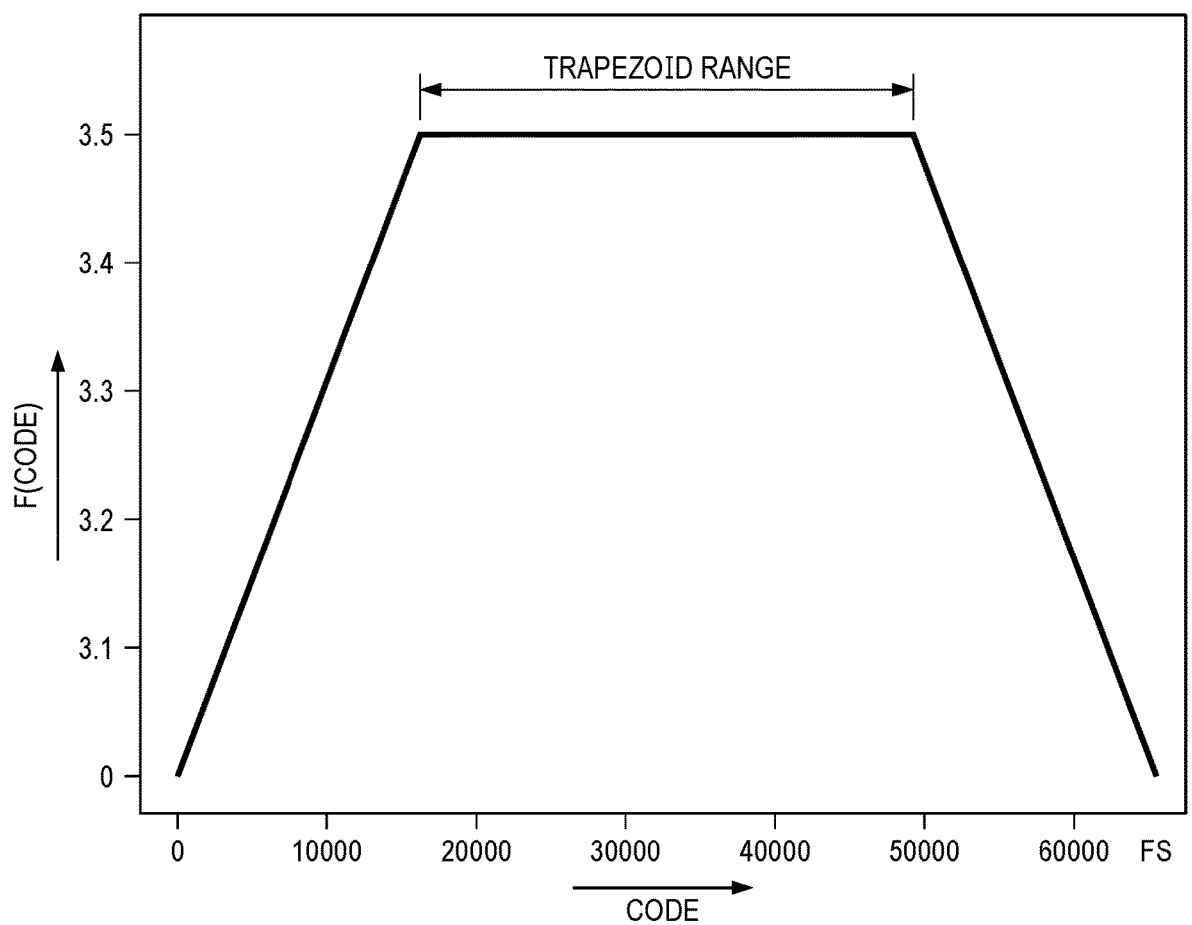
FIG. 4 illustrates an example trapezoidal function utilized by the second example ADC of FIG. 2.

An example trapezoidal function 400 that may be utilized by the weight calculation circuitry 380 is illustrated in FIG. 4. In the example of FIG. 4, the trapezoidal function 400 approaches zero (0) at the extremes of the output range of the ADC circuitry 115 and the ADC circuitry 120, which correspond to regions of saturation of the ADC circuitry 115 and the ADC circuitry 120. For midrange output values/codes of the ADC circuitry 115 and the second ADC 120, the trapezoidal function 400 approaches or equals 0.5.

Returning to FIG. 3, the weight calculation circuitry 380 of the illustrated example calculates a first weight, α, to apply to the adjusted first output signal associated with the ADC circuitry 115 based on Equation 2, which is:

$$\alpha = \frac{f(\text{code0})}{f(\text{code0}) + f(\text{code1})} \quad (2)$$

In Equation 2, code0 represents the value/code at the output 140 of the ADC circuitry 115, code1 represents the value/code at the output 145 of the ADC circuitry 120, and $f(\bullet)$ represents the trapezoidal function 400. As such, the weight calculation circuitry 380 calculates the first weight (α) to apply to the adjusted first output signal associated with the ADC circuitry 115 by (i) evaluating the trapezoidal function 400 ($f(\bullet)$) for the value/code (code0) at the output 140 of the ADC circuitry 115 to determine a first value ($f$(code0)), (ii) evaluating the trapezoidal function 400 ($f(\bullet)$) for the value/code (code1) at the output 145 of the ADC circuitry 120 to determine a second value ($f$(code1)), and (iii) dividing the first value ($f$(code0)) by the sum of the first value ($f$(code0)) and the second value ($f$(code1)) to determine the first weight (α). The weight calculation circuitry 380 of the illustrated example further determines a second weight, 1−α, to apply to the adjusted second output signal associated with the ADC circuitry 120 by subtracting the first weight (α) from 1.

As described above, the example weight calculation circuitry 380 of FIG. 3 utilizes a trapezoidal function, such as the trapezoidal function 400, to calculate the first and second weights, α and 1−α. In some examples, the weight calculation circuitry 380 of FIG. 3 utilizes a function having a shape different from a trapezoidal function to calculate the weights. For example, weight calculation circuitry 380 can utilize a function having any shape that approaches zero (0) at the extremes and approaches/equals 0.5 in the midrange of the output values/codes of the ADC circuitry 115 and the ADC circuitry 120. Examples of such shapes include the trapezoidal function 400 of FIG. 4, a positive portion of a sinusoidal function, a semicircular function, a triangular function, etc.

In some examples, the ADC 300 includes means for calculating weights. For example, the means for calculating weights may be implemented by the weight calculation circuitry 380. In some examples, the weight calculation circuitry 380 may be instantiated by programmable circuitry such as the example programmable circuitry 1012 of FIG. 10. For instance, the weight calculation circuitry 380 may be instantiated by the example microprocessor 1100 of FIG. 11 executing machine executable instructions such as those implemented by at least block 835 of FIG. 8. In some examples, the weight calculation circuitry 380 may be instantiated by hardware logic circuitry, which may be implemented by an ASIC, XPU, or the FPGA circuitry 1200 of FIG. 12 configured and/or structured to perform operations corresponding to the machine readable instructions. Also, the weight calculation circuitry 380 may be instantiated by any other combination of hardware, software, and/or firmware. For example, the weight calculation circuitry 380 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In the illustrated example of FIG. 3, the weighted averaging circuitry 385 has a first input 386 coupled to the first output 263 of the dither removal circuitry 260, has a second input 387 coupled to the second output 264 of the dither removal circuitry 260, has a third input 388 coupled to the first output 383 of the weight calculation circuitry 380, and has a fourth input 289 coupled to the second output 384 of the weight calculation circuitry 380. The weighted averaging circuitry 385 of the illustrated example uses the first and second weights, $\alpha$ and $1-\alpha$, from the weight calculation circuitry 380 to generate a weighted combination of the adjusted first output signal associated with the ADC circuitry 115 and the adjusted second output signal associated with the ADC circuitry 120. The weighted averaging circuitry 385 provides the weighted combination at the ADC output 310. For example, the weighted averaging circuitry 385 generates the weighted combination as a weighted average of the adjusted first output signal associated with the ADC circuitry 115 and the adjusted second output signal associated with the ADC circuitry 120 according to Equation 3, which is:

$$\text{weighted}_{output} = \alpha * adj_{code0} + (1 - \alpha) * adj_{code1} \qquad (3)$$

In Equation 3, $adj_{code0}$ represents the adjusted first output signal associated with the ADC circuitry 115 (e.g., $adj_{code0}$=code0−$m0_{est}$*dither0), $adj_{code1}$ represents the adjusted second output signal associated with the ADC circuitry 120 (e.g., $adj_{code1}$=code1−$m1_{est}$*dither1), the symbol "*" represents multiplication, and $\text{weighted}_{output}$ represents the weighted average of the adjusted first output signal associated with the ADC circuitry 115 and the adjusted second output signal associated with the ADC circuitry 120. As such, the weighted averaging circuitry 385 determines the weighted average (weighted output) of the adjusted first output signal associated with the ADC circuitry 115 and the adjusted second output signal associated with the ADC circuitry 120 by (i) multiplying/scaling the adjusted first output signal ($adj_{code0}$) associated with the ADC circuitry 115 by the first weight ($\alpha$) to determine a first weighted value ($\alpha$*$adj_{code0}$), (ii) multiplying/scaling the adjusted second output signal ($adj_{code1}$) associated with the ADC circuitry 120 by the second weight ($1-\alpha$) to determine a second weighted value ($(1-\alpha)$*$adj_{code1}$), and (iii) summing/adding the first weighted value and the second weighted value to determine the weighted average ($\text{weighted}_{output}$) to provide at the ADC output 310.

In some examples, the ADC 300 includes means for weighted averaging. For example, the means for weighted averaging may be implemented by the weighted averaging circuitry 385. In some examples, the weighted averaging circuitry 385 may be instantiated by programmable circuitry such as the example programmable circuitry 1012 of FIG. 10. For instance, the weighted averaging circuitry 385 may be instantiated by the example microprocessor 1100 of FIG. 11 executing machine executable instructions such as those implemented by at least block 840 of FIG. 8. In some examples, the weighted averaging circuitry 385 may be instantiated by hardware logic circuitry, which may be implemented by an ASIC, XPU, or the FPGA circuitry 1200 of FIG. 12 configured and/or structured to perform operations corresponding to the machine readable instructions. Also, the weighted averaging circuitry 385 may be instantiated by any other combination of hardware, software, and/or firmware. For example, the weighted averaging circuitry 385 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

As noted above, the dither removal circuitry 260 operates to determine an estimate (m0_est) of the first magnitude signal (m0) and an estimate (m1_est) of the second magnitude signal (m1) used to form dither signals provided at the inputs 130 and 135 of the ADC circuitry 115 and the ADC circuitry 120, respectively. As further noted above, the dither removal circuitry 260 utilizes the estimate (m0_est) of the first magnitude signal (m0) and the estimate (m1_est) of the second magnitude signal (m1) to remove (or reduce) the effects of dither at the outputs 140 and 145 of the ADC circuitry 115 and the ADC circuitry 120, respectively.

In some examples, the dither removal circuitry 260 determines the estimate (m0_est) of the first magnitude signal (m0) based on (i) a difference (code0−code1) between the output signals at the outputs 140 and 145 of the ADC circuitry 115 and the ADC circuitry 120, respectively, and (ii) the first dither sequence (dith0) used by the dither generation circuitry 250 to generate the first dither signal (m0*dith0) provided at the input of the input 130 of the ADC circuitry 115. For example, the dither removal circuitry 260 can determine the estimate (m0_est) of the first magnitude signal (m0) by correlating the first dither sequence (dith0) with the difference (code0−code1) between the output signals at the outputs 140 and 145 of the ADC circuitry 115 and the ADC circuitry 120, respectively, which is represented mathematically by Equation 4, which is:

$$m0_{est} = (\text{code0} - \text{code1}) ** dith0 \qquad (4)$$

In Equation 4, the symbol "**" represents correlation. Mathematically, Equation 4 can be manipulated as shown in Equation 5, which is:

$$\begin{aligned} m0_{est} &= (\text{code0} - \text{code1}) ** dith0 \\ &= [(ADC_{input} + m0 * dith0) - (ADC_{input} + m1 * dith1)] ** dith0 \\ &= (m0 * dith0 - m1 * dith1) ** dith0 \end{aligned} \qquad (5)$$

Based on the last line of Equation 5, if the two dither sequences, dith0 and dith1, are uncorrelated, the correlation of dith0 with m1*dith1 would approach 0, and correlation of dith0 with m0*dith0 would approach m0 or, in other words, and the estimate (m0_est) of the first magnitude signal (m0). However, as noted above, in some examples, the dither generation circuitry 250 generates the first digital sequence (dith0) to be the negative of the second digital sequence (dith1) to cause the first and second dither signals provided at the inputs 130 and 135 of the ADC circuitry 115 and the ADC circuitry 120 to have opposite signs. Thus, the two dither sequences, dith0 and dith1, will be correlated in those examples.

Similarly, in some examples, the dither removal circuitry 260 determines the estimate (m1_est) of the second magnitude signal (m1) based on (i) a difference (code1−code0) between the output signals at the outputs 145 and 140 of the ADC circuitry 120 and ADC circuitry 115, respectively, and (ii) the second dither sequence (dith1) used by the dither generation circuitry 250 to generate the second dither signal (m1*dith1) provided at the input of the input 135 of the ADC circuitry 120. For example, the dither removal circuitry 260 can determine the estimate (m1_est) of the second magnitude signal (m1) by correlating the second dither sequence (dith1) with the difference (code1−code0) between the output signals at the outputs 145 and 135 of the ADC circuitry 120 and the ADC circuitry 115, respectively, which is represented mathematically by Equation 6, which is:

$$m1_{est} = (code1 - code0) ** dith1 \qquad (6)$$

Mathematically, Equation 6 can be manipulated as shown in Equation 7, which is:

$$\begin{aligned} m1_{est} &= (code1 - code0) ** dith1 \\ &= [(ADC_{input} + m1 * dith1) - (ADC_{input} + m0 * dith0)] ** dith1 \\ &= (m1 * dith1 - m0 * dith0) ** dith1 \end{aligned} \qquad (7)$$

Based on the last line of Equation 7, if the two dither sequences, dith0 and dith1, are uncorrelated, the correlation of dith1 with m0*dith0 would approach 0, and correlation of dith1 with m1*dith1 would approach m0 or, in other words, and the estimate (m0_est) of the first magnitude signal (m0). However, as noted above, in some examples, the dither generation circuitry 250 generates the first digital sequence (dith0) to be the negative of the second digital sequence (dith1) to cause the first and second dither signals provided at the inputs 130 and 135 of the ADC circuitry 115 and the ADC circuitry 120 to have opposite signs. Thus, the two dither sequences, dith0 and dith1, will be correlated in those examples.

To enable determination of the estimate (m0_est) of the first magnitude signal (m0) of the first dither signal based on Equation 4, and determination of the estimate (m1_est) of the second magnitude signal (m1) of the second dither signal based on Equation 6, in some examples, the dither generation circuitry 250 generates the first digital sequence (dith0) to be the negative of the second digital sequence (dith1) based on one or more conditions. By way of example, assume the first digital sequence (dith0) and the second digital sequence (dith1) can have values from a plurality of possible values. For example, if the first digital sequence (dith0) and the second digital sequence (dith1) are generated based on three (3) bits, the values of the first digital sequence (dith0) and the negative of the second digital sequence (dith1) could be selected (e.g., randomly, pseudo-randomly, etc.) from the following set of 8 possible values: [−3.5, −2.5, −1.5, −0.5, 0.5, 1.5, 2.5, 3.5]. An example condition used by the dither generation circuitry 250 to generate the first digital sequence (dith0) to be the negative of the second digital sequence (dith1) is that the dither generation circuitry 250 generates a given value of the first digital sequence (dith0) to be the negative of a corresponding value of the second digital sequence (dith1) when those two values do not equal a particular (e.g., predetermined) possible value from the set of possible values, such as the smallest, negative one of the possible values. For the preceding example, the particular possible value is −0.5 (which is the smallest negative possible value) and, thus, this condition would provide that the dither generation circuitry 250 generates a given value of the first digital sequence (dith0) to be the negative of a corresponding value of the second digital sequence (dith1) when neither of those values equals −0.5. However, if either of the generated values of the first digital sequence (dith0) or the second digital sequence (dith1) equals the particular possible value (e.g., −0.5 in this example), then the dither generation circuitry 250 selects (e.g., randomly, pseudo-randomly, etc.) the corresponding value of the other digital sequence to be any one of the possible values in the set of possible values.

An example of such a dither sequence generation scheme that can be implemented by the dither generation circuitry 250 is illustrated in Table 1.

TABLE 1

| dith0 | −3.5 | −2.5 | −1.5 | −0.5 | select from (−3.5, −2.5, −1.5, −0.5, 0.5, 1.5, 2.5, 3.5) | 1.5 | 2.5 | 3.5 |
|---|---|---|---|---|---|---|---|---|
| dith1 | 3.5 | 2.5 | 1.5 | select from (−3.5, −2.5, −1.5, −0.5, 0.5, 1.5, 2.5, 3.5) | −0.5 | −1.5 | −2.5 | −3.5 |

As shown in Table 1, the dither generation circuitry 250 sets the values of the first digital sequence (dith0) to be the negative of the corresponding values of the second digital sequence (dith1) for sample intervals for which a selected (randomly, pseudo-randomly, etc.) pair of corresponding sequence values is (dith0, dith1)=(−3.5, 3.5), (−2.5, 2.5), (−1.5, 1.5), (1.5, −1.5), (2.5, −2.5), (3.5, −3.5). However, for sample intervals for which the selected (randomly, pseudo-randomly, etc.) value of one of the first digital sequence (dith0) or the second digital sequence (dith1) is −0.5, the dither generation circuitry 250 selects (randomly, pseudo-randomly, etc.) the corresponding value of the other one of the first digital sequence (dith0) or the second digital sequence (dith1) from the set of possible values (−3.5, −2.5, −1.5, −0.5, 0.5, 1.5, 2.5, 3.5).

Thus, during sample intervals for which the value of the second digital sequence (dith1) is the particular possible value (e.g., −0.5 in this example), the first digital sequence (dith0) is uncorrelated with the second digital sequence (dith1). Likewise, during sample intervals for which the value of the first digital sequence (dith0) is the particular possible value (e.g., −0.5 in this example), the second digital sequence (dith1) is uncorrelated with the first digital sequence (dith0). Accordingly, in such an example, the dither removal circuitry 260 determines the estimate (m0_est) of the first magnitude signal (m0) according to Equation 4 under the condition that the first output 149 of the ADC circuitry 115 and the output 145 of the ADC circuitry 120 are not saturated and the second digital sequence (dith1) has a value equal to the particular possible values (e.g., −0.5 in the foregoing example). Likewise, the dither removal circuitry 260 determines the estimate (m1_est) of the second magnitude signal (m1) according to Equation 6 under the condition that the output 140 of the ADC circuitry 115 and the output 145 of the ADC circuitry 120 are not saturated and the first digital sequence (dith0) has a value equal to the particular possible values (e.g., −0.5 in the foregoing example). In some such examples, the full range of the ADC input (e.g., the ADC input 105, 205, 305) is reduced by the minimum magnitude of the dither signal corresponding to that particular possible value (e.g., −0.5 in the foregoing example) to prevent saturation during sample intervals when the first digital sequence (dith0) or the second digital sequence (dith1) are set to that value.

Figure 5:
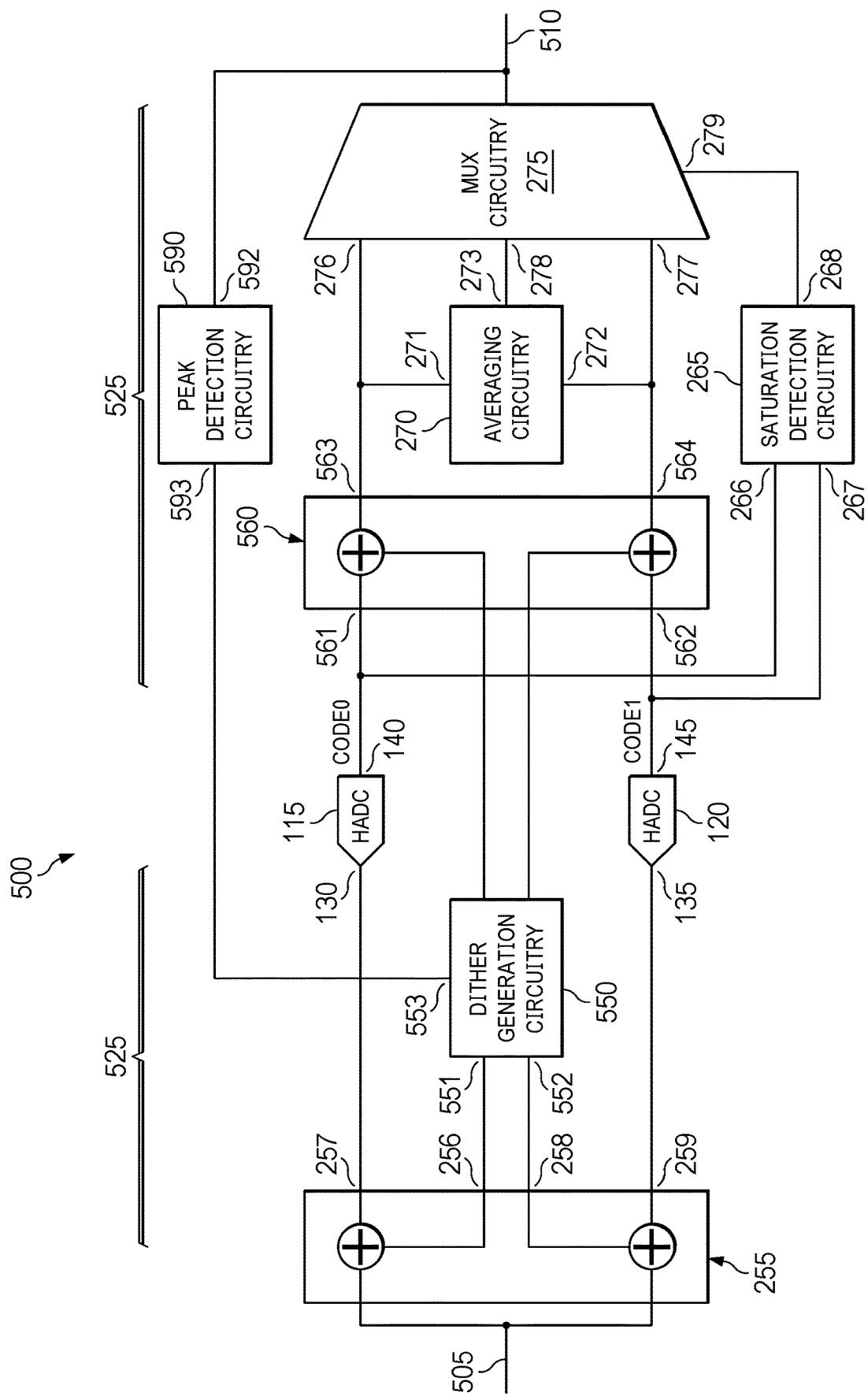
FIG. 5 is a block diagram of a third example implementation of the ADC of FIG. 1.

FIG. 5 is a block diagram of an example ADC 500 that corresponds to a third example implementation of the ADC 102 of FIG. 1. The ADC 500 is designed to implement a third example dithering technique based on teachings of this description. The ADC 500 of FIG. 5 may be instantiated (e.g., creating an instance of, bring into being for any length of time, materialize, implement, etc.) by programmable circuitry such as a Central Processor Unit (CPU) executing first instructions. Also, the ADC 500 of FIG. 5 may be instantiated (e.g., creating an instance of, bring into being for any length of time, materialize, implement, etc.) by (i) an Application Specific Integrated Circuit (ASIC) and/or (ii) a Field Programmable Gate Array (FPGA) structured and/or configured in response to execution of second instructions to perform operations corresponding to the first instructions. Some or all of the circuitry of FIG. 5 may, thus, be instantiated at the same or different times. Some or all of the circuitry of FIG. 5 may be instantiated, for example, in one or more threads executing concurrently on hardware and/or in series on hardware. Moreover, in some examples, some or all of the circuitry of FIG. 5 may be implemented by microprocessor circuitry executing instructions and/or FPGA circuitry performing operations to implement one or more virtual machines and/or containers.

The example ADC 500 of FIG. 5 has an example ADC input 505 and an example ADC output 510 that correspond respectively to the example ADC input 105 and the example ADC output 110 described above in connection with FIG. 1. As such, the ADC input 505 accepts an analog input signal, such as an analog voltage signal, an analog current signal, etc. The ADC output 510 provides an output digital signal that is a sequence of digital values, or digital codes, representative of values the analog input signal at successive sample times based on a sampling rate of the ADC.

The example ADC 500 of FIG. 5 also includes the first example ADC circuitry 115 and the second example ADC circuitry 120 described above in connection with FIG. 1. As such, descriptions of the first example ADC circuitry 115 and the second example ADC circuitry 120 are provided above in connection with the discussion of FIG. 1 and, in the interest of brevity, are not reproduced in the discussion of FIG. 5.

The example ADC 500 of FIG. 5 further includes example dither circuitry 525 that corresponds to a third example implementation of the dither circuitry 125 of FIG. 1. In the illustrated example of FIG. 5, the dither circuitry 525 includes the dither application circuitry 255, the saturation detection circuitry 265, the averaging circuitry 270 and the multiplexer circuitry 275 described above in connection with FIG. 2. As such, descriptions of the dither generation circuitry 250, the dither application circuitry 255, the saturation detection circuitry 265, the averaging circuitry 270 and the multiplexer circuitry 275 are provided above in connection with the discussion of FIG. 2 and, in the interest of brevity, are not reproduced in the discussion of FIG. 5.

In the illustrated example of FIG. 5, the dither circuitry 525 also includes example dither generation circuitry 550 that replaces the generation circuitry 250 described above in connection with FIG. 2, example dither removal circuitry 560 that replaces the dither removal circuitry 260 described above in connection with FIG. 2, and example peak detection circuitry 590.

Like the dither generation circuitry 250 described above, the dither generation circuitry 550 generates a first dither signal and provides the first dither signal via a first output 551. The first dither signal is used to modify the ADC input 205 to produce a first dithered input signal to apply to the input 130 of the ADC circuitry 115 Like the dither generation circuitry 250 described above, the dither generation circuitry 550 also generates a second dither signal and provides the second dither signal via a second output 552. The second dither signal is used to modify the ADC input 205 to produce a second dithered input signal to apply to the input 135 of the ADC circuitry 120. However, the dither generation circuitry 550 generates the first dither signal based on a first group of magnitude signals ($m0_1$, $m0_2$, ... ) and a corresponding first group of digital sequences ($dith0_1$, $dith0_2$, ... ). For example, the dither generation circuitry 550 generates the first dither signal by summing (adding) products of the respective magnitude signals and digital sequences (e.g., first dither signal=$\Sigma m0_i * dith0_i$). Likewise, the dither generation circuitry 550 generates the second dither signal based on a second group of magnitude signals ($m1_1$, $m1_2$, ... ) and a corresponding second group of digital sequences ($dith1_1$, $dith1_2$, ... ). For example, the dither generation circuitry 550 generates the second dither signal by summing (adding) products of the respective magnitude signals and digital sequences (e.g., second dither signal=$\Sigma m1_i * dith1_i$). Furthermore, the dither generation circuitry 550 sets the values of the first group of digital sequences to be the negatives of the corresponding values of the second group of digital sequences (e.g., $dith1_i = -dith0_i$) to cause the first dither signal and the second dither signal to have opposite signs, at least under one or more conditions, as described above.

The example dither generation circuitry 550 also has a third input 553 to accept one or more control signals from the peak detection circuitry 590. The dither generation circuitry 550 of the illustrated example includes attack logic to respond to the one or more control signals from the peak detection circuitry 590 to reduce the magnitudes of the first and second dither signals when the saturation detection circuitry 265 detects the output 140 of the ADC circuitry 115 or the output 145 of the ADC circuitry 120 is saturated. For example, even one saturated output sample can cause the peak detection circuitry 590 of the illustrated example to set a control signal to trigger the attack logic of the dither generation circuitry 550 to reduce the magnitudes of the first and second dither signals. In some examples, the attack logic of the dither generation circuitry 550 reduces the magnitudes of the first and second dither signals by (i) setting values of the first group of digital sequences ($dith0_1$, $dith0_2$, . . . ) and the second group of digital sequences ($dith1_1$, $dith1_2$, . . . ) based on a pattern, rather than letting the values be selected (e.g., randomly, pseudo-randomly, etc.) from a set of possible values, and/or (ii) reducing one or more values of the first group of magnitude signals ($m0_1$, $m0_2$, . . . ) and the second group of magnitude signals ($m1_1$, $m1_2$, . . . ) to specified reduced (e.g., lowest) values, based on a pattern, etc.

In the illustrated example, the dither generation circuitry 550 of the illustrated example also include decay logic to respond to the one or more control signals from the peak detection circuitry 590 to return dither signal generation back to normal after the attack logic has been triggered due to saturation of the output 140 of the ADC circuitry 115 or the output 145 of the ADC circuitry 120. In some examples, the peak detection circuitry 290 includes a counter to define a running frame of ADC output samples to be examined after the attack logic of the dither generation circuitry 550 is triggered, and resets the counter in response to a determination that the output 140 of the ADC circuitry 115 or the output 145 of the ADC circuitry 120 is saturated. In such examples, the peak detection circuitry 290 detects the peak magnitude in the running frame of ADC output samples and instructs the decay logic of the dither generation circuitry 550 to set values of the first group of digital sequences ($dith0_1$, $dith0_2$, . . . ) and the second group of digital sequences ($dith1_1$, $dith1_2$, . . . ) based on the detected peak magnitude.

Table 2 illustrates example patterns used by the dither generation circuitry 550 to set the values of the first group of digital sequences ($dith0_1$, $dith0_2$, . . . ) and the second group of digital sequences ($dith1_1$, $dith1_2$, . . . ) based on control signals from the peak detection circuitry 290.

TABLE 2

| ADC output value (code) | Dither signal magnitude (dB) | D0: ±128 | D1: 256 | D2: ±512 |
| --- | --- | --- | --- | --- |
| −3200 to 3200 | −2.14 | Running | Running | Running |
| −3712 to −3200, or 3200 to 3712 | −0.86 | Running | −1 | 1 |
| −3968 to −3712, or 3712 to 3968 | −0.28 | 1 | 1 | −1 |

The illustrated example of Table 2 is based on the ADC circuitry 115 and the ADC circuitry 120 supporting 13-bit output values, and the first and second groups of dither sequences including 3 sequences based on 3 respective dither bits, D0, D1 and D2, that can take on values of ±1. In the illustrated example of Table 2, the dither bit D2 represents the most significant bit (MSB) and, thus, its values of ±1 map to a first dither sequence with values of ±512. In the illustrated example of Table 2, the dither bit D1 represents the next MSB and, thus, its values of ±1 map to a second dither sequence with values of ±256. In the illustrated example of Table 2, the dither bit D1 represents the least significant bit (LSB) and, thus, its values of ±1 map to a third dither sequence with values of ±128.

In the illustrated example of Table 2, when the output 140 of the ADC circuitry 115 and the output 145 of the ADC circuitry 120 are not saturated, the control signal(s) from the peak detection circuitry 590 output control information to indicate that the dither generation circuitry 550 is to operate according to the first row of Table 2. Based on that control information, the dither generation circuitry 550 permits each of the dither bits D1, D2 and D3 to run, thereby causing the values of the different digital sequences used to generate the dither signals to be selected from the set of possible sequence values corresponding to the possible values of the dither bits D1, D2 and D3. However, when saturation is detected, the control signal(s) from the peak detection circuitry 590 output control information to indicate that the dither generation circuitry 550 is to operate according to the second to third rows of Table 2, depending on the detected ADC output value. Based on that control information, the peak detection circuitry 590 causes the attack logic of the dither generation circuitry 550 to set value(s) of one of more of the different digital sequences of the dither signals based on the pattern of Table 2. For example, the attack logic of the dither generation circuitry 550 may set the values of the different digital sequences used to generate the dither signals based on the pattern of values of the dither bits D1, D2 and D3 listed in the last row of Table 2.

In the illustrated example of FIG. 5, the peak detection circuitry 590 has an input 592 coupled to the ADC output 510 (which corresponds to the output of the multiplexer circuitry 275), and has an output 593 to couple to the input 553 of the dither generation circuitry 550 to provide the one or more control signals to the dither generation circuitry 550. Subsequently to the attack logic of the dither generation circuitry 550 being triggered in response to saturation being detected, the peak detection circuitry 590 monitors a frame of output samples to detect a peak of the output samples. In the example of Table 2, the decay logic of the dither generation circuitry 550 uses the peak value to output control signal(s) to set the values of the different digital sequences of the dither signals. For example, when the peak value is in the range of (−3968 to −3712) or (3712 to 3968), the peak detection circuitry 590 sets its output control signal(s) to cause the decay logic of the dither generation circuitry 550 to set the values of the different digital sequences used to generate the dither signals based on the pattern of values of the dither bits D1, D2 and D3 listed in the fourth (last) row of Table 2. However, when the peak value is in the range of (−3712 to −3200) or (3200 to 3712), the peak detection circuitry 590 sets its output control signal(s) to cause the decay logic of the dither generation circuitry 550 to set the values of the different digital sequences used to generate the dither signals based on the pattern of values of the dither bits D1, D2 and D3 listed in the third row of Table 2. Otherwise, the peak detection circuitry 590 sets its output control signal(s) to cause the decay logic of the dither generation circuitry 550 to set the values of the different digital sequences used to generate the dither signals based on the pattern of values of the dither bits D1, D2 and D3 listed in the second row of Table 2.

In some examples, the ADC 500 includes means for generating dither signals. For example, the means for generating dither signals may be implemented by the dither generation circuitry 550. In some examples, the dither generation circuitry 550 may be instantiated by programmable circuitry such as the example programmable circuitry 1012 of FIG. 10. For instance, the dither generation circuitry 550 may be instantiated by the example microprocessor 1100 of FIG. 11 executing machine executable instructions such as those implemented by at least block 905 of FIG. 9. In some examples, the dither generation circuitry 550 may be instantiated by hardware logic circuitry, which may be implemented by an ASIC, XPU, or the FPGA circuitry 1200 of FIG. 12 configured and/or structured to perform operations corresponding to the machine readable instructions.

Also, the dither generation circuitry 550 may be instantiated by any other combination of hardware, software, and/or firmware. For example, the dither generation circuitry 550 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

In some examples, the ADC 500 includes means for detecting signal sample peaks. For example, the means for detecting signal sample peaks may be implemented by the peak detection circuitry 590. In some examples, the peak detection circuitry 590 may be instantiated by programmable circuitry such as the example programmable circuitry 1012 of FIG. 10. For instance, the peak detection circuitry 590 may be instantiated by the example microprocessor 1100 of FIG. 11 executing machine executable instructions such as those implemented by at least block 935 of FIG. 9. In some examples, the peak detection circuitry 590 may be instantiated by hardware logic circuitry, which may be implemented by an ASIC, XPU, or the FPGA circuitry 1200 of FIG. 12 configured and/or structured to perform operations corresponding to the machine readable instructions. Also, the peak detection circuitry 590 may be instantiated by any other combination of hardware, software, and/or firmware. For example, the peak detection circuitry 590 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

Like the dither removal circuitry 260 described above, the dither removal circuitry 560 of the illustrated example has a first input 561 that is coupled to the output 140 of the ADC circuitry 115, and has a second input 562 that is coupled to the output 145 of the ADC circuitry 120. The dither removal circuitry 560 adjusts the output signal at the output 140 of the ADC circuitry 115 to remove (or reduce) the effects of the first dither signal at the input 130 of the ADC circuitry 115. Likewise, the dither removal circuitry 560 of the illustrated example adjusts the output signal at the output 145 of the ADC circuitry 120 to remove (or reduce) the effects of the second dither signal at the input 135 of the ADC circuitry 120. As such, like the dither removal circuitry 260 described above, the dither removal circuitry 560 provides, via a first output 563, an adjusted first output signal associated with the ADC circuitry 115, and provides, via a second output 564, an adjusted second output signal associated with the ADC circuitry 120.

Similar to the dither removal circuitry 260 described above, the dither removal circuitry 560 also determines estimates of the first group of magnitude signals $(m0_1, m0_2, \ldots)$ used to generate the first dither signal (e.g., first dither signal=$\Sigma m0_i * dith0_i$), and estimates of the second group of magnitude signals $(m1_1, m1_2, \ldots)$ used to generate the second dither signal (e.g., second dither signal=$\Sigma m1_i * dith1_i$). However, the dither removal circuitry 560 restricts estimation of the magnitude signals to those magnitude signals with corresponding digital sequence value $(dith0_1, dith0_2, \ldots)$ and $(dith1_1, dith1_2, \ldots)$ that are selected by the dither generation circuitry 550 from the set of possible values and are not set based on a pattern due saturation detection.

For example, Table 3 shows example patterns of magnitude signal estimation permitted by the dither removal circuitry 560. The example magnitude signal estimation patterns of Table 3 correspond to the example patterns in Table 2 used by the dither generation circuitry 550 to set the values of the first group of digital sequences $(dith0_1, dith0_2, \ldots)$ and the second group of digital sequences $(dith1_1, dith1_2, \ldots)$ based on control signals from the peak detection circuitry 290.

TABLE 3

| ADC output value (code) | Dither signal magnitude (dB) | D0: ±128 | D1: 256 | D2: ±512 |
|---|---|---|---|---|
| −3200 to 3200 | −2.14 | Enabled | Enabled | Enabled |
| −3712 to −3200, or 3200 to 3712 | −0.86 | Enabled | Disabled | Disabled |
| −3968 to −3712, or 3712 to 3968 | −0.28 | Disabled | Disabled | Disabled |

The illustrated example of Table 3 is based on the ADC circuitry 115 and the ADC circuitry 120 supporting 13-bit output values, the first and second groups of dither sequences including 3 sequences based on 3 respective dither bits, D0, D1 and D2, and the first and second groups of magnitude signals including 3 magnitude signals $(m0_1, m0_2, m0_3)$ and $(m1_1, m1_2, m1_3)$ corresponding to the 3 respective dither bits, D0, D1 and D2. In the illustrated example of Table 3, the dither removal circuitry 560 enables estimation of the magnitude signals $(m0_1, m0_2, m0_3)$ and $(m1_1, m1_2, m1_3)$ corresponding to the dither bits D0, D1 and D2 that are running in Table 2, and disables estimation of the magnitude signals $(m0_1, m0_2, m0_3)$ and $(m1_1, m1_2, m1_3)$ corresponding to the dither bits D0, D1 and D2 that are set based on a pattern in Table 2 due to ADC saturation.

In some examples, the ADC 500 includes means for removing dither signal effects. For example, the means for removing dither signal effects may be implemented by the dither removal circuitry 560. In some examples, the dither removal circuitry 560 may be instantiated by programmable circuitry such as the example programmable circuitry 1012 of FIG. 10. For instance, the dither removal circuitry 560 may be instantiated by the example microprocessor 1100 of FIG. 11 executing machine executable instructions such as those implemented by at least blocks 915 and 920 of FIG. 9. In some examples, the dither removal circuitry 560 may be instantiated by hardware logic circuitry, which may be implemented by an ASIC, XPU, or the FPGA circuitry 1200 of FIG. 12 configured and/or structured to perform operations corresponding to the machine readable instructions. Also, the dither removal circuitry 560 may be instantiated by any other combination of hardware, software, and/or firmware. For example, the dither removal circuitry 560 may be implemented by at least one or more hardware circuits (e.g., processor circuitry, discrete and/or integrated analog and/or digital circuitry, an FPGA, an ASIC, an XPU, a comparator, an operational-amplifier (op-amp), a logic circuit, etc.) configured and/or structured to execute some or all of the machine readable instructions and/or to perform some or all of the operations corresponding to the machine readable instructions without executing software or firmware, but other structures are likewise appropriate.

While an example manner of implementing the ADC 102 of FIG. 1 is illustrated in FIGS. 1-5, one or more of the elements, processes, and/or devices illustrated in FIGS. 1-5 may be combined, divided, re-arranged, omitted, eliminated, and/or implemented in any other way. Further, the first example ADC circuitry 115, the second example ADC circuitry 120, the example dither circuitry 125, the example ADC 200, the example dither circuitry 225, the example dither generation circuitry 250, the example dither application circuitry 255, the example dither removal circuitry 260, the example saturation detection circuitry 265, the example averaging circuitry 270, the example multiplexer circuitry 275, the example ADC 300, the example dither circuitry 325, the example weight calculation circuitry 380, the example weighted averaging circuitry 385, the example ADC 500, the example dither circuitry 525, the example dither generation circuitry 550, the example dither removal circuitry 560, the peak detection circuitry 590 and/or, more generally, the example ADC 102 of FIG. 1, may be implemented by hardware alone or by hardware in combination with software and/or firmware. Thus, for example, any of the first example ADC circuitry 115, the second example ADC circuitry 120, the example dither circuitry 125, the example ADC 200, the example dither circuitry 225, the example dither generation circuitry 250, the example dither application circuitry 255, the example dither removal circuitry 260, the example saturation detection circuitry 265, the example averaging circuitry 270, the example multiplexer circuitry 275, the example ADC 300, the example dither circuitry 325, the example weight calculation circuitry 380, the example weighted averaging circuitry 385, the example ADC 500, the example dither circuitry 525, the example dither generation circuitry 550, the example dither removal circuitry 560, the peak detection circuitry 590 and/or, more generally, the example ADC 102, could be implemented by programmable circuitry in combination with machine readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), and/or field programmable logic device(s) (FPLD(s)) such as FPGAs. Further still, the example ADC 102 of FIG. 1 may include one or more elements, processes, and/or devices in addition to, or instead of, those illustrated in FIGS. 1-5, and/or may include more than one of any or all of the illustrated elements, processes and devices.

Flowchart(s) representative of example machine readable instructions, which may be executed by programmable circuitry to implement and/or instantiate the ADC 102 of FIG. 1 and/or representative of example operations which may be performed by programmable circuitry to implement and/or instantiate the ADC 102 of FIG. 1, are shown in FIGS. 6-9. The machine readable instructions may be one or more executable programs or portion(s) of one or more executable programs for execution by programmable circuitry such as the programmable circuitry 1012 shown in the example processor platform 1000 described below in connection with FIG. 10 and/or may be one or more function(s) or portion(s) of functions to be performed by the example programmable circuitry (e.g., an FPGA) described below in connection with FIGS. 11 and/or 12. In some examples, the machine readable instructions cause an operation, a task, etc., to be carried out and/or performed in an automated manner in the real world. As used herein, "automated" means without human involvement.

The program may be embodied in instructions (e.g., software and/or firmware) stored on one or more non-transitory computer readable and/or machine readable storage medium such as cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EEPROM), flash memory, etc.), volatile memory (e.g., Random Access Memory (RAM) of any type, etc.), and/or any other storage device or storage disk. The instructions of the non-transitory computer readable and/or machine readable medium may program and/or be executed by programmable circuitry located in one or more hardware devices, but the entire program and/or parts thereof could alternatively be executed and/or instantiated by one or more hardware devices other than the programmable circuitry and/or embodied in dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a human and/or machine user) or an intermediate client hardware device gateway (e.g., a radio access network (RAN)) that may facilitate communication between a server and an endpoint client hardware device. Similarly, the non-transitory computer readable storage medium may include one or more mediums. Further, although the example program is described with reference to the flowchart(s) illustrated in FIGS. 6-9, many other methods of implementing the example ADC 102 may alternatively be used. For example, the order of execution of the blocks of the flowchart(s) may be changed, and/or some of the blocks described may be changed, eliminated, or combined. Also, any or all of the blocks of the flow chart may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The programmable circuitry may be distributed in different network locations and/or local to one or more hardware devices (e.g., a single-core processor (e.g., a single core CPU), a multi-core processor (e.g., a multi-core CPU, an XPU, etc.)). For example, the programmable circuitry may be a CPU and/or an FPGA located in the same package (e.g., the same integrated circuit (IC) package or in two or more separate housings), one or more processors in a single machine, multiple processors distributed across multiple servers of a server rack, multiple processors distributed across one or more server racks, etc., and/or any combination(s) thereof.

The machine readable instructions described herein may be stored in one or more of a compressed format, an encrypted format, a fragmented format, a compiled format, an executable format, a packaged format, etc. Machine readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to create, manufacture, and/or produce machine executable instructions. For example, the machine readable instructions may be fragmented and stored on one or more storage devices, disks and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to cause them to be directly readable, interpretable, and/or executable by a computing device and/or other machine. For example, the machine readable instructions may be stored in multiple parts, which are individually compressed, encrypted, and/or stored on separate computing devices, such that the parts when decrypted, decompressed, and/or combined form a set of computer-executable and/or machine executable instructions that implement one or more functions and/or operations that may together form a program such as that described herein.

In another example, the machine readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable, computer readable and/or machine readable media, as used herein, may include instructions and/or program(s) regardless of the particular format or state of the machine readable instructions and/or program(s).

The machine readable instructions described herein can be represented by any past, present, or future instruction language, scripting language, programming language, etc. For example, the machine readable instructions may be represented using any of the following languages: C, C++, Java, C #, Perl, Python, JavaScript, HyperText Markup Language (HTML), Structured Query Language (SQL), Swift, etc.

As mentioned above, the example operations of FIGS. 6-9 may be implemented using executable instructions (e.g., computer readable and/or machine readable instructions) stored on one or more non-transitory computer readable and/or machine readable media. As used herein, the terms non-transitory computer readable medium, non-transitory computer readable storage medium, non-transitory machine readable medium, and/or non-transitory machine readable storage medium are expressly defined to include any type of computer readable storage device and/or storage disk and to exclude propagating signals and to exclude transmission media. Examples of such non-transitory computer readable medium, non-transitory computer readable storage medium, non-transitory machine readable medium, and/or non-transitory machine readable storage medium include optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms "non-transitory computer readable storage device" and "non-transitory machine readable storage device" are defined to include any physical (mechanical, magnetic and/or electrical) hardware to retain information for a time period, but to exclude propagating signals and to exclude transmission media. Examples of non-transitory computer readable storage devices and/or non-transitory machine readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine readable instructions, etc., and/or manufactured to execute computer-readable instructions, machine-readable instructions, etc.

Figure 6:
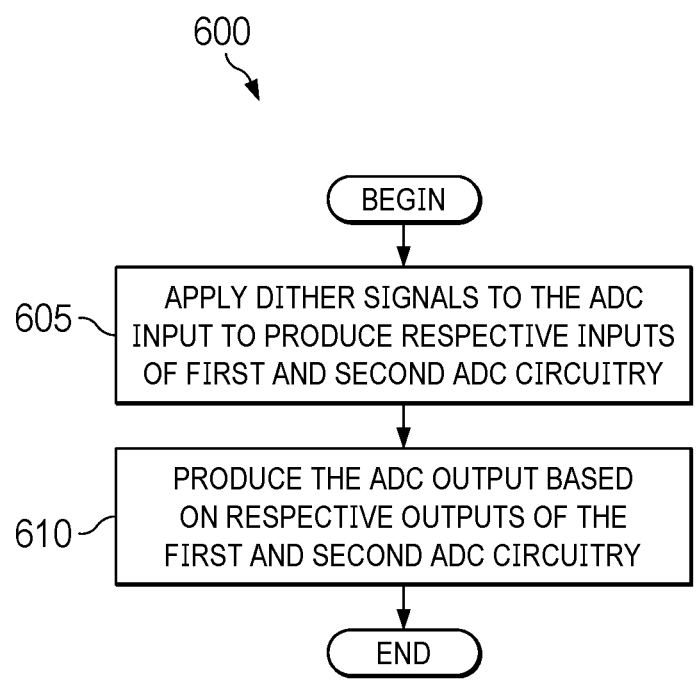
FIGS. 6-9 are flowcharts representative of example machine readable instructions and/or example operations that may be executed, instantiated, and/or performed by example programmable circuitry to implement the ADC of FIG. 1.

FIG. 6 is a flowchart representative of example machine readable instructions and/or example operations 600 that may be executed, instantiated, and/or performed by programmable circuitry to implement dithering in the example ADC 102 of FIG. 1. The example machine-readable instructions and/or the example operations 600 of FIG. 6 begin at block 605, at which the dither circuitry 125 of the ADC 102 applies dither signals to the ADC input 105 to produce respective first and second dithered input signals to apply to the input 130 of the ADC circuitry 115 and the input 135 of the ADC circuitry 120, as described above. At block 610, the dither circuitry 125 produces an output signal at the ADC output 110 based on the output 140 of the ADC circuitry 115 and the output 145 of the ADC circuitry 120, as described above. The example machine-readable instructions and/or the example operations 600 then end.

Figure 7:
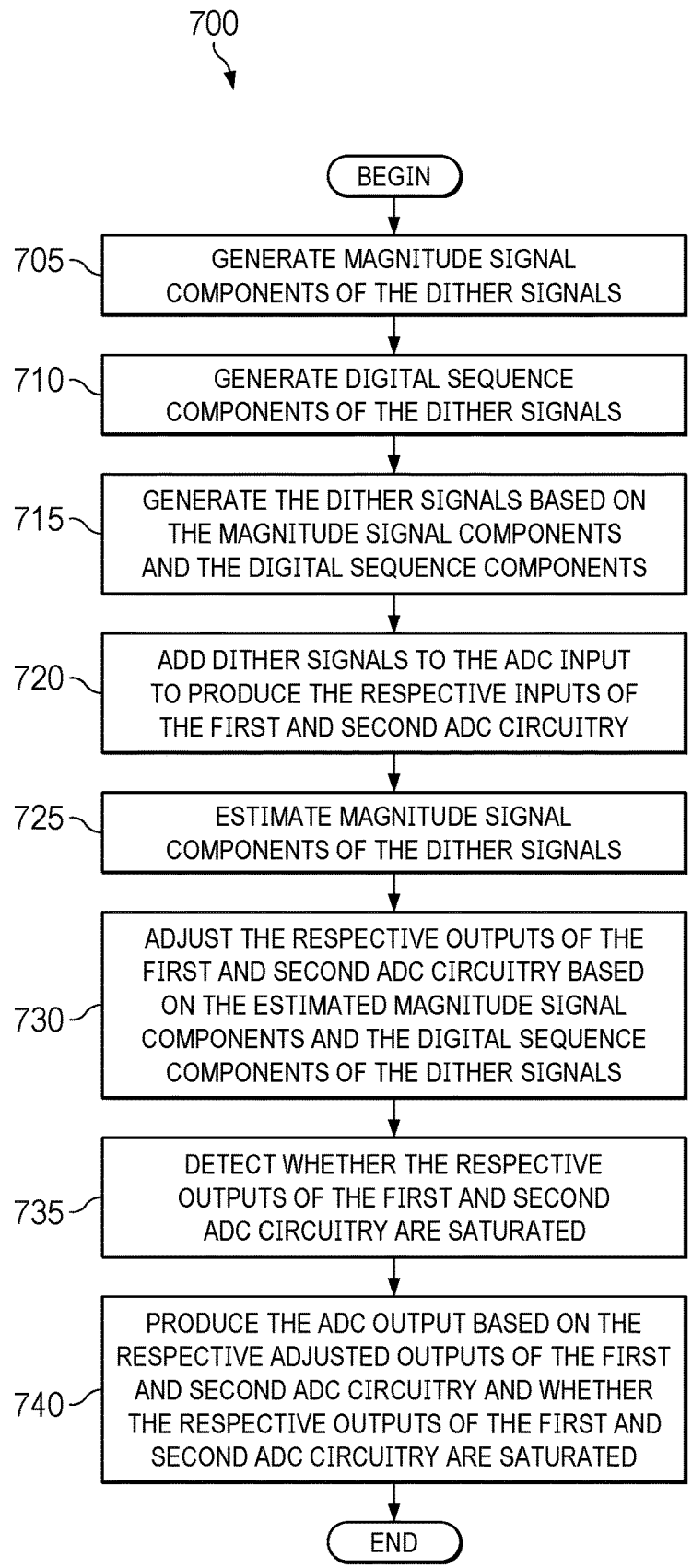

FIG. 7 is a flowchart representative of example machine readable instructions and/or example operations 700 that may be executed, instantiated, and/or performed by programmable circuitry to implement dithering in the example ADC 200 of FIG. 2, which corresponds to a first example implementation of the example ADC 102 of FIG. 1. The example machine-readable instructions and/or the example operations 700 of FIG. 7 begin at block 705, at which the dither generation circuitry 250 of the ADC 200 generates the magnitude signal components (e.g., m0 and m1) of the first and second dither signals, as described above. At block 710, the dither generation circuitry 250 generates the digital sequence components (e.g., dith0 and dith1) of the first and second dither signals, as described above. At block 715, the dither generation circuitry 250 generates the first and second dither signals based on the magnitude signals components and digital sequence components, as described above (e.g., as m0*dith0 and m1*dith1). At block 720, the dither application circuitry 255 of the ADC 200 adds the first and second dither signals to an input signal at the ADC input 205 to produce respective first and second dithered input signals to apply to the input 130 of the ADC circuitry 115 and the input 135 of the ADC circuitry 120, as described above.

At block 725, the dither removal circuitry 260 of the ADC 200 estimates the magnitude signal components of the first and second dither signals (e.g., m0_est and m1_est), as described above. At block 730, the dither removal circuitry 260 adjusts the output signal at the output 140 of the ADC circuitry 115 and the output signal at the output 145 of the ADC circuitry 120 based on the estimates the magnitude signal components (e.g., m0_est and m1_est) and the digital sequence components (e.g., dith0 and dith1) to produce the adjusted first output signal and the adjusted second output signal associated respectively with the ADC circuitry 115 and the ADC circuitry 120, as described above.

At block 735, the saturation detection circuitry 265 of the ADC 200 detects whether the output 140 of the ADC circuitry 115 or the output 145 of the ADC circuitry 120 is saturated, as described above. At block 740, the averaging circuitry 270 and the multiplexer circuitry 275 of the ADC 200 produce an output signal at the ADC output 210 based on the adjusted first output signal and the adjusted second output signal associated respectively with the ADC circuitry 115 and the ADC circuitry 120, and whether the output 140 of the ADC circuitry 115 or the output 145 of the ADC circuitry 120 is saturated, as described above. For example, and as described above, the multiplexer circuitry 275 outputs the adjusted first output signal associated with the ADC circuitry 115 if the output 145 of the ADC circuitry 120 is saturated, outputs the adjusted second output signal associated with the ADC circuitry 120 if the output 140 of the ADC circuitry 115 is saturated, and otherwise outputs an average of the adjusted first output signal and the adjusted second output signal determined by the averaging circuitry 270. The example machine-readable instructions and/or the example operations 700 then end.

Figure 8:
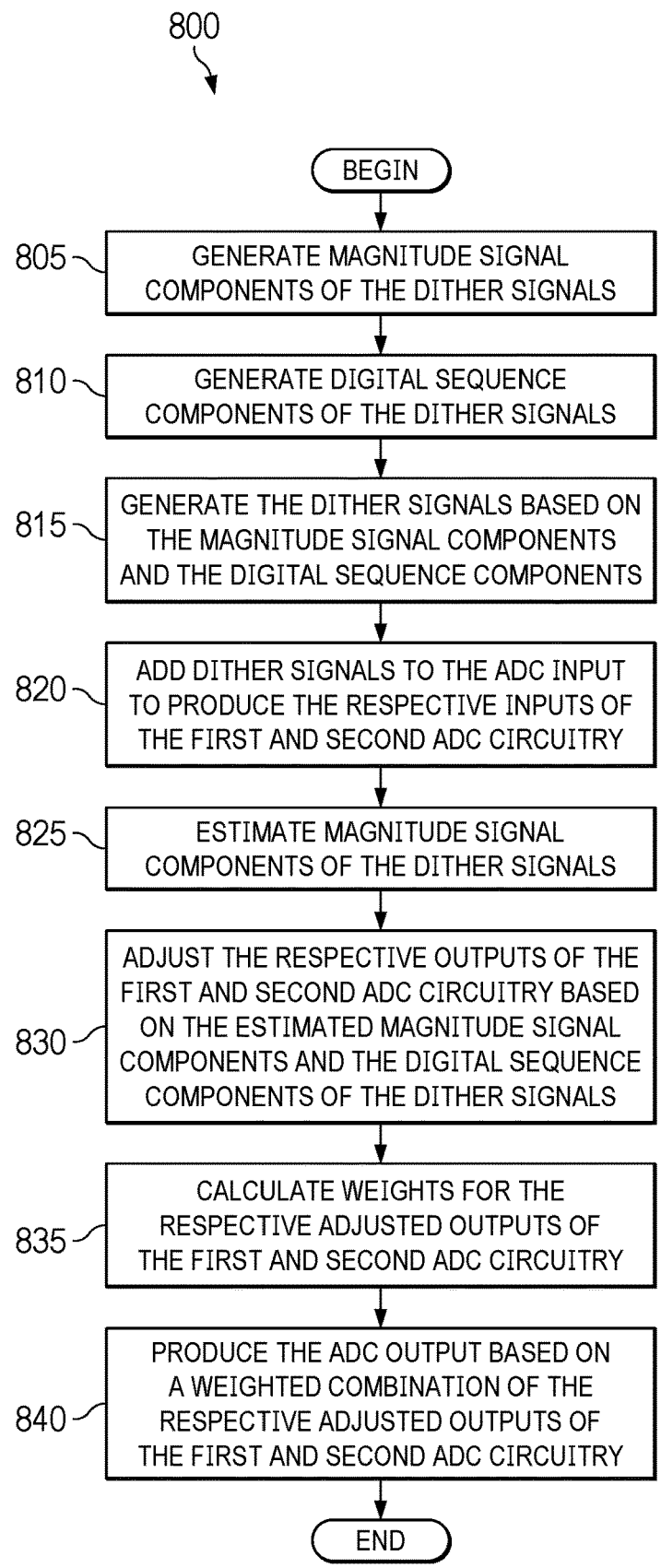

FIG. 8 is a flowchart representative of example machine readable instructions and/or example operations 800 that may be executed, instantiated, and/or performed by programmable circuitry to implement dithering in the example ADC 300 of FIG. 3, which corresponds to a second example implementation of the example ADC 102 of FIG. 1. The example machine-readable instructions and/or the example operations 800 of FIG. 8 begin at block 805, at which the dither generation circuitry 250 of the ADC 300 generates the magnitude signal components (e.g., m0 and m1) of the first and second dither signals, as described above. At block 810, the dither generation circuitry 250 generates the digital sequence components (e.g., dith0 and dith1) of the first and second dither signals, as described above. At block 815, the dither generation circuitry 250 generates the first and second dither signals based on the magnitude signals components and digital sequence components, as described above (e.g., as m0*dith0 and m1*dith1). At block 820, the dither application circuitry 255 of the ADC 300 adds the first and second dither signals to an input signal at the ADC input 305 to produce respective first and second dithered input signals to apply to the input 130 of the ADC circuitry 115 and the input 135 of the ADC circuitry 120, as described above.

At block 825, the dither removal circuitry 260 of the ADC 300 estimates the magnitude signal components of the first and second dither signals (e.g., m0_est and m1_est), as described above. At block 830, the dither removal circuitry 260 adjusts the output signal at the output 140 of the ADC circuitry 115 and the output signal at the output 145 of the ADC circuitry 120 based on the estimates the magnitude signal components (e.g., m0_est and m1_est) and the digital sequence components (e.g., dith0 and dith1) to produce the adjusted first output signal and the adjusted second output signal associated respectively with the ADC circuitry 115 and the ADC circuitry 120, as described above.

At block 835, the weight calculation circuitry 380 of the ADC 300 calculates the first and second weights, $\alpha$ and 1-$\alpha$, for the adjusted first output signal and the adjusted second output signal associated respectively with the ADC circuitry 115 and the ADC circuitry 120, as described above. At block 840, the weighted averaging circuitry 385 of the ADC 300 determines a weighted combination (e.g., weighted average) of the adjusted first output signal and the adjusted second output signal based on the first and second weights, and provides the weighted combination to the ADC output 310, as described above. The example machine-readable instructions and/or the example operations 800 then end.

Figure 9:
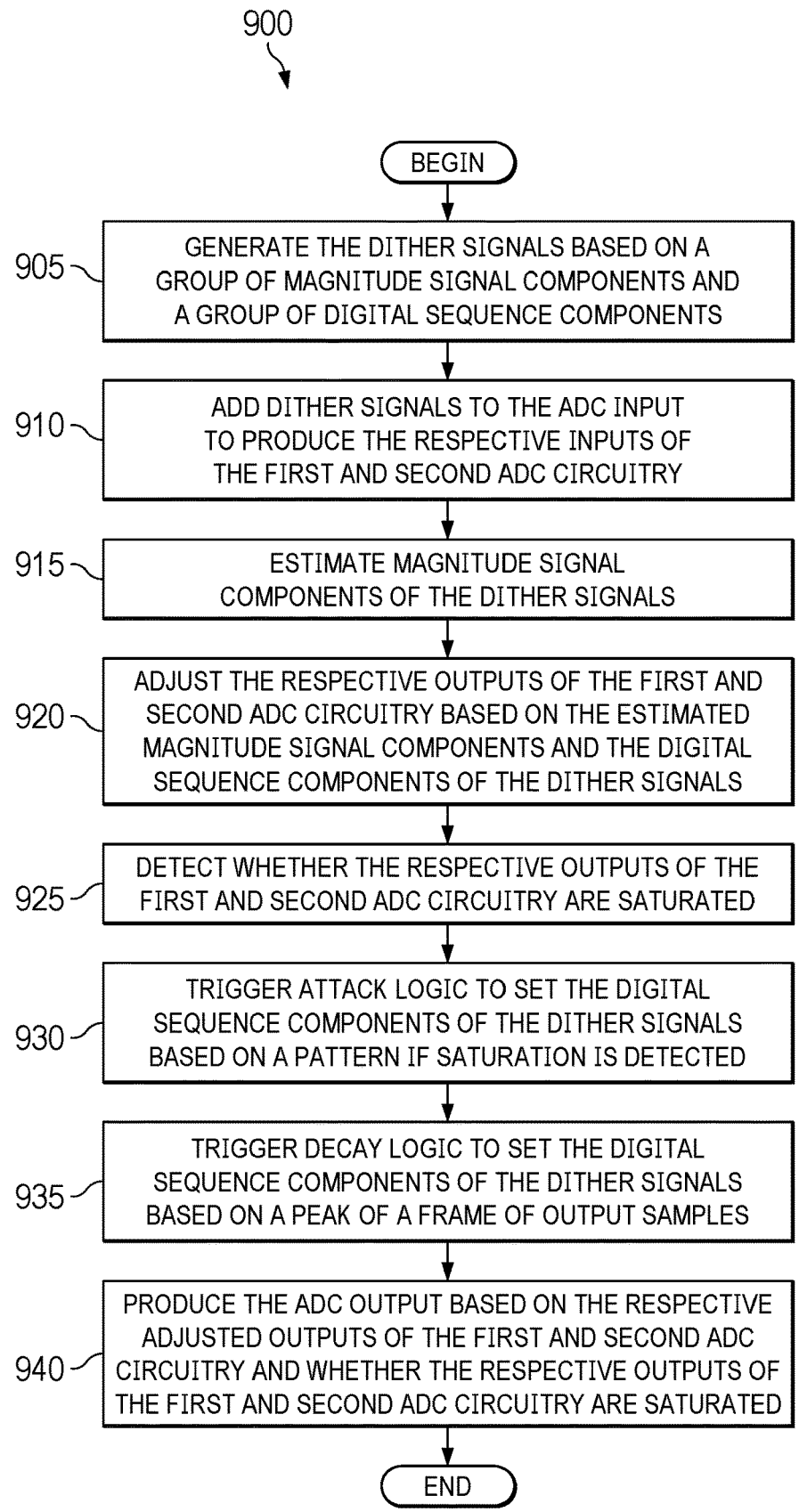

FIG. 9 is a flowchart representative of example machine readable instructions and/or example operations 900 that may be executed, instantiated, and/or performed by programmable circuitry to implement dithering in the example ADC 500 of FIG. 5, which corresponds to a third example implementation of the example ADC 102 of FIG. 1. The example machine-readable instructions and/or the example operations 900 of FIG. 9 begin at block 905, at which the dither generation circuitry 550 of the ADC 500 generates the first and second dither signals based on a group of magnitude signal components (e.g., $m0_1$, $m0_2$, . . . and $m1_1$, $m1_2$, . . . ) and a group of digital sequence components (e.g., $dith0_1$, $dith0_2$, . . . and $dith1_1$, $dith1_2$, . . . ), as described above. At block 910, the dither application circuitry 255 of the ADC 500 adds the first and second dither signals to an input signal at the ADC input 505 to produce respective first and second dithered input signals to apply to the input 130 of the ADC circuitry 115 and the input 135 of the ADC circuitry 120, as described above.

At block 915, the dither removal circuitry 560 of the ADC 500 estimates the magnitude signal components of the first and second dither signals according to Table 3, as described above. At block 920, the dither removal circuitry 560 of the ADC 500 adjusts the output signal at the output 140 of the ADC circuitry 115 and the output signal at the output 145 of the ADC circuitry 120 based on the estimates the magnitude signal components and the digital sequence components to produce the adjusted first output signal and the adjusted second output signal associated respectively with the ADC circuitry 115 and the ADC circuitry 120, as described above.

At block 925, the saturation detection circuitry 265 of the ADC 200 detects whether the output 140 of the ADC circuitry 115 or the output 145 of the ADC circuitry 120 is saturated, as described above. At block 930, the peak detection circuitry 590 of the ADC 500 triggers that attack logic of the dither generation circuitry 550 to set the digital sequence components of the dither signals based on the pattern of Table 2 if the output 140 of the ADC circuitry 115 or the output 145 of the ADC circuitry 120 is saturated, as described above. At block 935, the peak detection circuitry 590 detects a peak in a frame of output samples at the ADC output 510 and triggers the decay logic of the dither generation circuitry 550 to set the digital sequence components of the dither signals based on the detected peak and the pattern of Table 2, as described above.

At block 940, the averaging circuitry 270 and the multiplexer circuitry 275 of the ADC 500 produce an output signal at the ADC output 510 based on the adjusted first output signal and the adjusted second output signal associated respectively with the ADC circuitry 115 and the ADC circuitry 120, and whether the output 140 of the ADC circuitry 115 or the output 145 of the ADC circuitry 120 are saturated, as described above. For example, and as described above, the multiplexer circuitry 275 outputs the adjusted first output signal associated with the ADC circuitry 115 if the output 145 of the ADC circuitry 120 is saturated, outputs the adjusted second output signal associated with the ADC circuitry 120 if the output 140 of the ADC circuitry 115 is saturated, and otherwise outputs an average of the adjusted first output signal and the adjusted second output signal determined by the averaging circuitry 270. The example machine-readable instructions and/or the example operations 900 then end.

Figure 10:
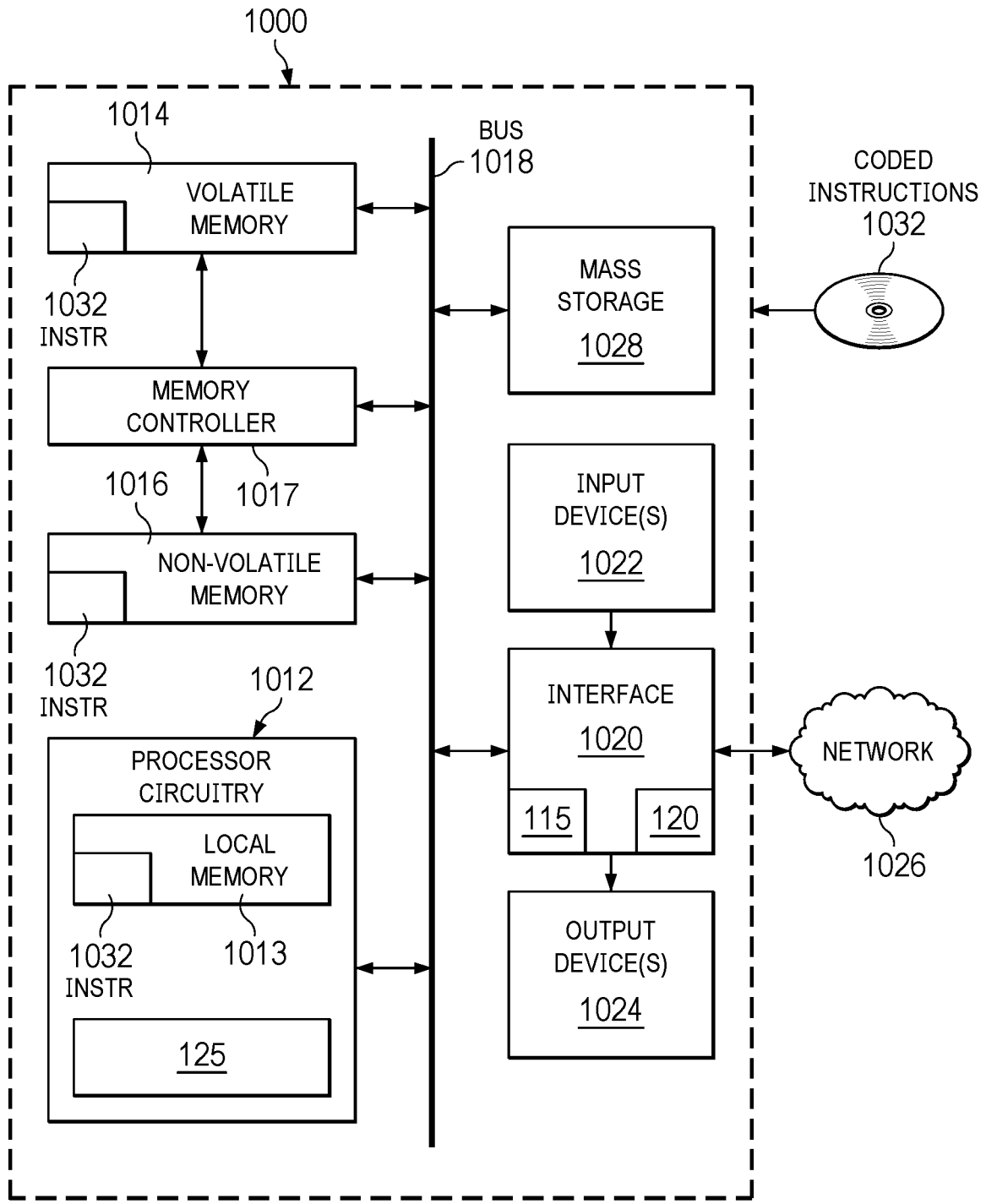
FIG. 10 is a block diagram of an example processing platform including programmable circuitry structured to execute, instantiate, and/or perform the example machine readable instructions and/or perform the example operations of FIGS. 6-9 to implement the ADC of FIG. 1.

FIG. 10 is a block diagram of an example programmable circuitry platform 1000 structured to execute and/or instantiate the example machine-readable instructions and/or the example operations of FIGS. 6-9 to implement the ADC 102 of FIG. 1. The programmable circuitry platform 1000 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing and/or electronic device.

The programmable circuitry platform 1000 of the illustrated example includes programmable circuitry 1012. The programmable circuitry 1012 of the illustrated example is hardware. For example, the programmable circuitry 1012 can be implemented by one or more integrated circuits, logic circuits, FPGAs, microprocessors, CPUs, GPUs, DSPs, and/or microcontrollers from any desired family or manufacturer. The programmable circuitry 1012 may be implemented by one or more semiconductor based (e.g., silicon based) devices. In this example, the programmable circuitry 1012 implements the example dither circuitry 125 of the example ADC 102. As such, the programmable circuitry 1012 can implement the example dither circuitry 225, the example dither circuitry 325 and/or the example dither circuitry 525, which are example implementation of the dither circuitry 125.

The programmable circuitry 1012 of the illustrated example includes a local memory 1013 (e.g., a cache, registers, etc.). The programmable circuitry 1012 of the illustrated example is in communication with main memory 1014, 1016, which includes a volatile memory 1014 and a non-volatile memory 1016, by a bus 1018. The volatile memory 1014 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1016 may be implemented by flash memory and/or any other desired type of memory device. Access to the main memory 1014, 1016 of the illustrated example is controlled by a memory controller 1017. In some examples, the memory controller 1017 may be implemented by one or more integrated circuits, logic circuits, microcontrollers from any desired family or manufacturer, or any other type of circuitry to manage the flow of data going to and from the main memory 1014, 1016.

The programmable circuitry platform 1000 of the illustrated example also includes interface circuitry 1020. The interface circuitry 1020 may be implemented by hardware associated with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 1022 are connected to the interface circuitry 1020. The input device(s) 1022 permit(s) a user (e.g., a human user, a machine user, etc.) to enter data and/or commands into the programmable circuitry 1012. The input device(s) 1022 can be implemented by, for example, an audio sensor, a microphone, a camera (still or video), a keyboard, a button, a mouse, a touchscreen, a trackpad, a trackball, an isopoint device, and/or a voice recognition system.

One or more output devices 1024 are also connected to the interface circuitry 1020 of the illustrated example. The output device(s) 1024 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1020 of the illustrated example, thus, may include a graphics driver card, a graphics driver chip, and/or graphics processor circuitry such as a GPU.

The interface circuitry 1020 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1026. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc. In the illustrated example, the interface circuitry implements the first example ADC circuitry 115 and the second example ADC circuitry described above.

The programmable circuitry platform 1000 of the illustrated example also includes one or more mass storage discs or devices 1028 to store firmware, software, and/or data. Examples of such mass storage discs or devices 1028 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs.

The machine readable instructions 1032, which may be implemented by the machine readable instructions of FIGS. 6-9, may be stored in the mass storage device 1028, in the volatile memory 1014, in the non-volatile memory 1016, and/or on at least one non-transitory computer readable storage medium such as a CD or DVD which may be removable.

Figure 11:
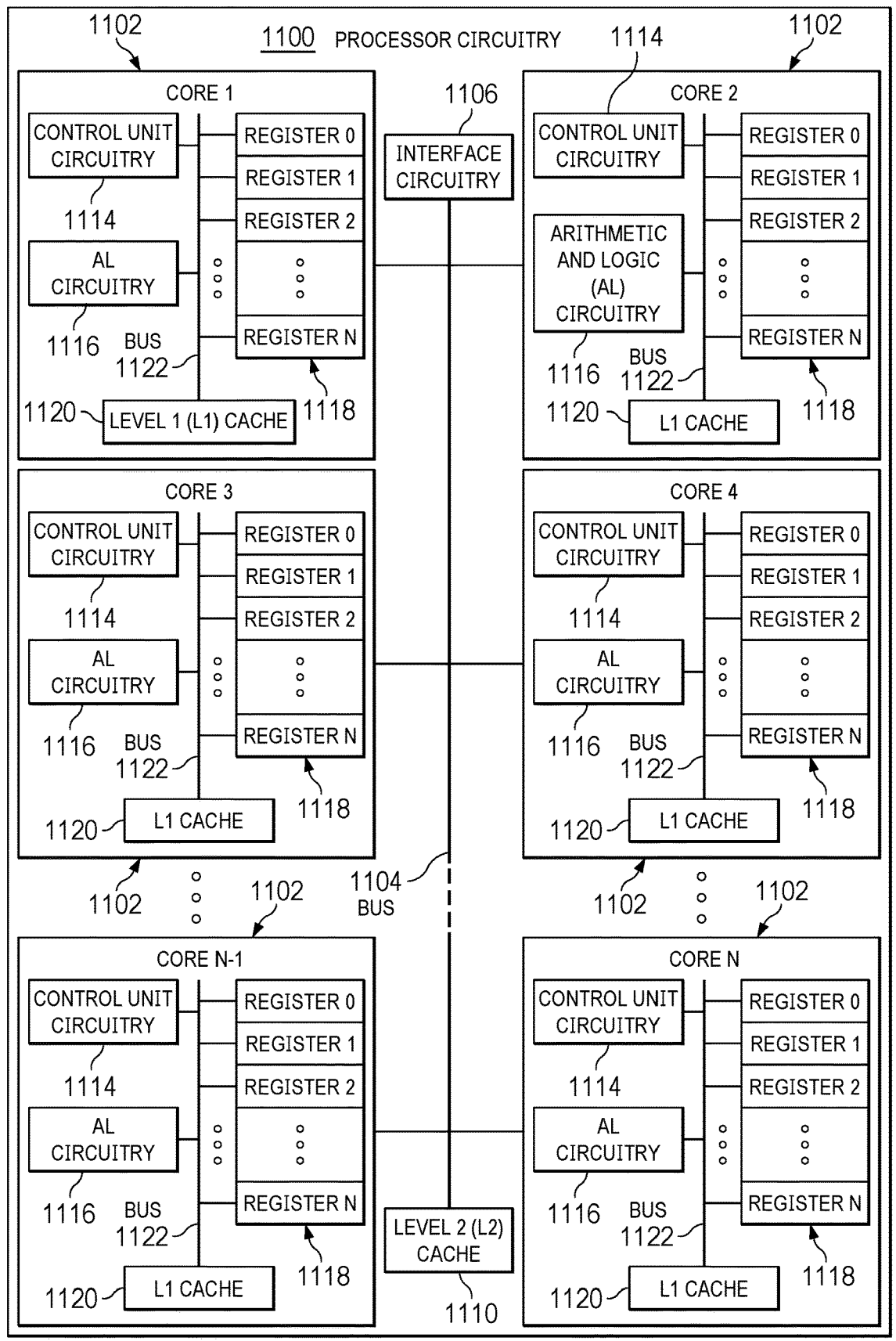
FIG. 11 is a block diagram of an example implementation of the programmable circuitry of FIG. 10.

FIG. 11 is a block diagram of an example implementation of the programmable circuitry 1012 of FIG. 10. In this example, the programmable circuitry 1012 of FIG. 10 is implemented by a microprocessor 1100. For example, the microprocessor 1100 may be a general-purpose microprocessor (e.g., general-purpose microprocessor circuitry). The microprocessor 1100 executes some or all of the machine-readable instructions of the flowcharts of FIGS. 6-9 to effectively instantiate the circuitry of FIG. 2 as logic circuits to perform operations corresponding to those machine readable instructions. In some such examples, the circuitry of FIG. 1 is instantiated by the hardware circuits of the microprocessor 1100 in combination with the machine-readable instructions. For example, the microprocessor 1100 may be implemented by multi-core hardware circuitry such as a CPU, a DSP, a GPU, an XPU, etc. Although it may include any number of example cores 1102 (e.g., 1 core), the microprocessor 1100 of this example is a multi-core semiconductor device including N cores. The cores 1102 of the microprocessor 1100 may operate independently or may cooperate to execute machine readable instructions. For example, machine code corresponding to a firmware program, an embedded software program, or a software program may be executed by one of the cores 1102 or may be executed by multiple ones of the cores 1102 at the same or different times. In some examples, the machine code corresponding to the firmware program, the embedded software program, or the software program is split into threads and executed in parallel by two or more of the cores 1102. The software program may correspond to a portion or all of the machine readable instructions and/or operations represented by the flowcharts of FIGS. 6-9.

The cores 1102 may communicate by a first example bus 1104. In some examples, the first bus 1104 may be implemented by a communication bus to effectuate communication associated with one(s) of the cores 1102. For example, the first bus 1104 may be implemented by at least one of an Inter-Integrated Circuit (I2C) bus, a Serial Peripheral Interface (SPI) bus, a PCI bus, or a PCIe bus. Also, the first bus 1104 may be implemented by any other type of computing or electrical bus. The cores 1102 may obtain data, instructions, and/or signals from one or more external devices by example interface circuitry 1106. The cores 1102 may output data, instructions, and/or signals to the one or more external devices by the interface circuitry 1106. Although the cores 1102 of this example include example local memory 1120 (e.g., Level 1 (L1) cache that may be split into an L1 data cache and an L1 instruction cache), the microprocessor 1100 also includes example shared memory 1110 that may be shared by the cores (e.g., Level 2 (L2 cache)) for high-speed access to data and/or instructions. Data and/or instructions may be transferred (e.g., shared) by writing to and/or reading from the shared memory 1110. The local memory 1120 of each of the cores 1102 and the shared memory 1110 may be part of a hierarchy of storage devices including multiple levels of cache memory and the main memory (e.g., the main memory 1014, 1016 of FIG. 10). Higher levels of memory in the hierarchy exhibit lower access time and have smaller storage capacity than lower levels of memory. Changes in the various levels of the cache hierarchy are managed (e.g., coordinated) by a cache coherency policy.

Each core 1102 may be referred to as a CPU, DSP, GPU, etc., or any other type of hardware circuitry. Each core 1102 includes control unit circuitry 1114, arithmetic and logic (AL) circuitry (sometimes referred to as an ALU) 1116, a plurality of registers 1118, the local memory 1120, and a second example bus 1122. Other structures may be present. For example, each core 1102 may include vector unit circuitry, single instruction multiple data (SIMD) unit circuitry, load/store unit (LSU) circuitry, branch/jump unit circuitry, floating-point unit (FPU) circuitry, etc. The control unit circuitry 1114 includes semiconductor-based circuits structured to control (e.g., coordinate) data movement within the corresponding core 1102. The AL circuitry 1116 includes semiconductor-based circuits structured to perform one or more mathematic and/or logic operations on the data within the corresponding core 1102. The AL circuitry 1116 of some examples performs integer based operations. In other examples, the AL circuitry 1116 also performs floating-point operations. In yet other examples, the AL circuitry 1116 may include first AL circuitry that performs integer-based operations and second AL circuitry that performs floating-point operations. In some examples, the AL circuitry 1116 may be referred to as an Arithmetic Logic Unit (ALU).

The registers 1118 are semiconductor-based structures to store data and/or instructions such as results of one or more of the operations performed by the AL circuitry 1116 of the corresponding core 1102. For example, the registers 1118 may include vector register(s), SIMD register(s), general-purpose register(s), flag register(s), segment register(s), machine-specific register(s), instruction pointer register(s), control register(s), debug register(s), memory management register(s), machine check register(s), etc. The registers 1118 may be arranged in a bank as shown in FIG. 11. Alternatively, the registers 1118 may be organized in any other arrangement, format, or structure, such as by being distributed throughout the core 1102 to shorten access time. The second bus 1122 may be implemented by at least one of an I2C bus, a SPI bus, a PCI bus, or a PCIe bus.

Each core 1102 and/or, more generally, the microprocessor 1100 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 1100 is a semiconductor device fabricated to include many transistors interconnected to implement the structures described above in one or more integrated circuits (ICs) contained in one or more packages.

The microprocessor 1100 may include and/or cooperate with one or more accelerators (e.g., acceleration circuitry, hardware accelerators, etc.). In some examples, accelerators are implemented by logic circuitry to perform certain tasks more quickly and/or efficiently than can be done by a general-purpose processor. Examples of accelerators include ASICs and FPGAs such as those described herein. A GPU, DSP and/or other programmable device can also be an accelerator. Accelerators may be on-board the microprocessor 1100, in the same chip package as the microprocessor 1100 and/or in one or more separate packages from the microprocessor 1100.

Figure 12:
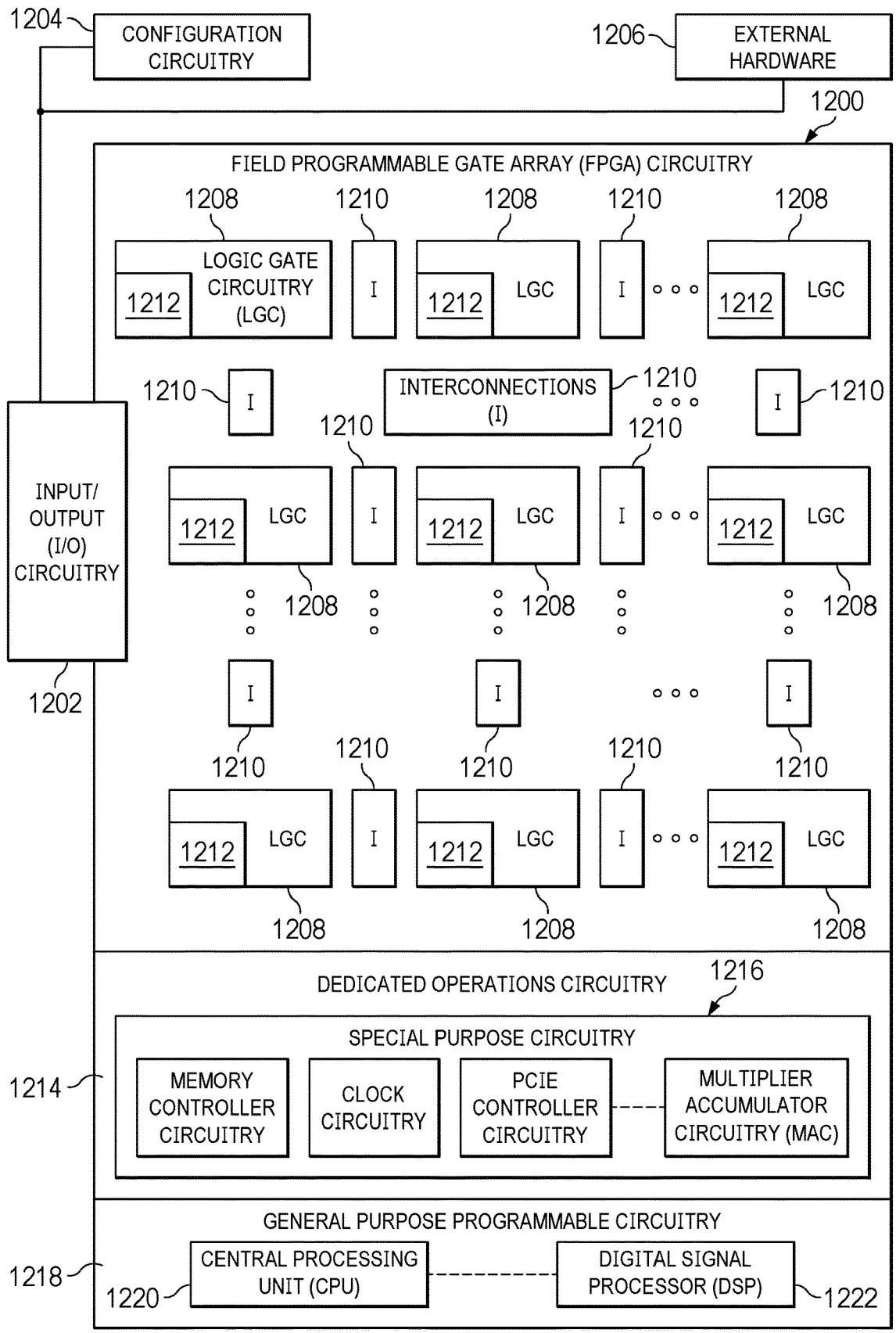
FIG. 12 is a block diagram of another example implementation of the programmable circuitry of FIG. 10.

FIG. 12 is a block diagram of another example implementation of the programmable circuitry 1012 of FIG. 10. In this example, the programmable circuitry 1012 is implemented by FPGA circuitry 1200. For example, the FPGA circuitry 1200 may be implemented by an FPGA. The FPGA circuitry 1200 can be used, for example, to perform operations that could otherwise be performed by the example microprocessor 1100 of FIG. 11 executing corresponding machine readable instructions. However, once configured, the FPGA circuitry 1200 instantiates the operations and/or functions corresponding to the machine readable instructions in hardware and, thus, can often execute the operations/functions faster than they could be performed by a general-purpose microprocessor executing the corresponding software.

More specifically, in contrast to the microprocessor 1100 of FIG. 11 described above (which is a general purpose device that may be programmed to execute some or all of the machine readable instructions represented by the flowchart(s) of FIGS. 6-9 but whose interconnections and logic circuitry are fixed once fabricated), the FPGA circuitry 1200 of the example of FIG. 12 includes interconnections and logic circuitry that may be configured, structured, programmed, and/or interconnected in different ways after fabrication to instantiate, for example, some or all of the operations/functions corresponding to the machine readable instructions represented by the flowchart(s) of FIGS. 6-9. In particular, the FPGA circuitry 1200 may be thought of as an array of logic gates, interconnections, and switches. The switches can be programmed to change how the logic gates are interconnected by the interconnections, effectively forming one or more dedicated logic circuits (unless and until the FPGA circuitry 1200 is reprogrammed). The configured logic circuits enable the logic gates to cooperate in different ways to perform different operations on data received by input circuitry. Those operations may correspond to some or all of the instructions (e.g., the software and/or firmware)

represented by the flowchart(s) of FIGS. 6-9. As such, the FPGA circuitry 1200 may be configured and/or structured to effectively instantiate some or all of the operations/functions corresponding to the machine readable instructions of the flowchart(s) of FIGS. 6-9 as dedicated logic circuits to perform the operations/functions corresponding to those software instructions in a dedicated manner analogous to an ASIC. Therefore, the FPGA circuitry 1200 may perform the operations/functions corresponding to the some or all of the machine readable instructions of FIGS. 6-9 faster than the general-purpose microprocessor can execute the same.

In the example of FIG. 12, the FPGA circuitry 1200 is configured and/or structured in response to being programmed (and/or reprogrammed one or more times) based on a binary file. In some examples, the binary file may be compiled and/or generated based on instructions in a hardware description language (HDL) such as Lucid, Very High Speed Integrated Circuits (VHSIC) Hardware Description Language (VHDL), or Verilog. For example, a user (e.g., a human user, a machine user, etc.) may write code or a program corresponding to one or more operations/functions in an HDL; the code/program may be translated into a low-level language as needed; and the code/program (e.g., the code/program in the low-level language) may be converted (e.g., by a compiler, a software application, etc.) into the binary file. In some examples, the FPGA circuitry 1200 of FIG. 12 may access and/or load the binary file to cause the FPGA circuitry 1200 of FIG. 12 to be configured and/or structured to perform the one or more operations/functions. For example, the binary file may be implemented by a bit stream (e.g., one or more computer-readable bits, one or more machine-readable bits, etc.), data (e.g., computer-readable data, machine-readable data, etc.), and/or machine-readable instructions accessible to the FPGA circuitry 1200 of FIG. 12 to cause configuration and/or structuring of the FPGA circuitry 1200 of FIG. 12, or portion(s) thereof.

In some examples, the binary file is compiled, generated, transformed, and/or otherwise output from a uniform software platform utilized to program FPGAs. For example, the uniform software platform may translate first instructions (e.g., code or a program) that correspond to one or more operations/functions in a high-level language (e.g., C, C++, Python, etc.) into second instructions that correspond to the one or more operations/functions in an HDL. In some such examples, the binary file is compiled, generated, and/or otherwise output from the uniform software platform based on the second instructions. In some examples, the FPGA circuitry 1200 of FIG. 12 may access and/or load the binary file to cause the FPGA circuitry 1200 of FIG. 12 to be configured and/or structured to perform the one or more operations/functions. For example, the binary file may be implemented by a bit stream (e.g., one or more computer-readable bits, one or more machine-readable bits, etc.), data (e.g., computer-readable data, machine-readable data, etc.), and/or machine-readable instructions accessible to the FPGA circuitry 1200 of FIG. 12 to cause configuration and/or structuring of the FPGA circuitry 1200 of FIG. 12, or portion(s) thereof.

The FPGA circuitry 1200 of FIG. 12, includes example input/output (I/O) circuitry 1202 to obtain and/or output data to/from example configuration circuitry 1204 and/or external hardware 1206. For example, the configuration circuitry 1204 may be implemented by interface circuitry that may obtain a binary file, which may be implemented by a bit stream, data, and/or machine-readable instructions, to configure the FPGA circuitry 1200, or portion(s) thereof. In some such examples, the configuration circuitry 1204 may obtain the binary file from a user, a machine (e.g., hardware circuitry (e.g., programmable or dedicated circuitry) that may implement an Artificial Intelligence/Machine Learning (AI/ML) model to generate the binary file), etc., and/or any combination(s) thereof). In some examples, the external hardware 1206 may be implemented by external hardware circuitry. For example, the external hardware 1206 may be implemented by the microprocessor 1100 of FIG. 11.

The FPGA circuitry 1200 also includes an array of example logic gate circuitry 1208, a plurality of example configurable interconnections 1210, and example storage circuitry 1212. The logic gate circuitry 1208 and the configurable interconnections 1210 are configurable to instantiate one or more operations/functions that may correspond to at least some of the machine readable instructions of FIGS. 6-9 and/or other desired operations. The logic gate circuitry 1208 shown in FIG. 12 is fabricated in blocks or groups. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 1208 to enable configuration of the electrical structures and/or the logic gates to form circuits to perform desired operations/functions. The logic gate circuitry 1208 may include other electrical structures such as look-up tables (LUTs), registers (e.g., flip-flops or latches), multiplexers, etc.

The configurable interconnections 1210 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1208 to program desired logic circuits.

The storage circuitry 1212 of the illustrated example is structured to store result(s) of the one or more of the operations performed by corresponding logic gates. The storage circuitry 1212 may be implemented by registers or the like. In the illustrated example, the storage circuitry 1212 is distributed amongst the logic gate circuitry 1208 to facilitate access and increase execution speed.

The example FPGA circuitry 1200 of FIG. 12 also includes example dedicated operations circuitry 1214. In this example, the dedicated operations circuitry 1214 includes special purpose circuitry 1216 that may be invoked to implement commonly used functions to avoid the need to program those functions in the field. Examples of such special purpose circuitry 1216 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1200 may also include example general purpose programmable circuitry 1218 such as an example CPU 1220 and/or an example DSP 1222. Other general purpose programmable circuitry 1218 may also be present such as a GPU, an XPU, etc., that can be programmed to perform other operations.

Although FIGS. 11 and 12 illustrate two example implementations of the programmable circuitry 1012 of FIG. 10, many other approaches are contemplated. For example, FPGA circuitry may include an on-board CPU, such as one or more of the example CPU 1220 of FIG. 11. Therefore, the programmable circuitry 1012 of FIG. 10 may also be implemented by combining at least the example microprocessor 1100 of FIG. 11 and the example FPGA circuitry 1200 of FIG. 12. In some such hybrid examples, one or more cores 1102 of FIG. 11 may execute a first portion of the machine readable instructions represented by the flowchart(s) of FIGS. 6-9 to perform first operation(s)/function(s), the FPGA circuitry 1200 of FIG. 12 may be configured and/or structured to perform second operation(s)/function(s) corresponding to a second portion of the machine readable instructions represented by the flowcharts of FIG. 6-9, and/or an ASIC may be configured and/or structured to perform third operation(s)/function(s) corresponding to a third portion of the machine readable instructions represented by the flowcharts of FIGS. 6-9.

Some or all of the circuitry of FIG. 1 may, thus, be instantiated at the same or different times. For example, same and/or different portion(s) of the microprocessor 1100 of FIG. 11 may be programmed to execute portion(s) of machine-readable instructions at the same and/or different times. In some examples, same and/or different portion(s) of the FPGA circuitry 1200 of FIG. 12 may be configured and/or structured to perform operations/functions corresponding to portion(s) of machine-readable instructions at the same and/or different times.

In some examples, some or all of the circuitry of FIG. 1 may be instantiated, for example, in one or more threads executing concurrently and/or in series. For example, the microprocessor 1100 of FIG. 11 may execute machine readable instructions in one or more threads executing concurrently and/or in series. In some examples, the FPGA circuitry 1200 of FIG. 12 may be configured and/or structured to carry out operations/functions concurrently and/or in series. Moreover, in some examples, some or all of the circuitry of FIG. 1 may be implemented within one or more virtual machines and/or containers executing on the microprocessor 1100 of FIG. 11.

In some examples, the programmable circuitry 1012 of FIG. 10 may be in one or more packages. For example, the microprocessor 1100 of FIG. 11 and/or the FPGA circuitry 1200 of FIG. 12 may be in one or more packages. In some examples, an XPU may be implemented by the programmable circuitry 1012 of FIG. 10, which may be in one or more packages. For example, the XPU may include a CPU (e.g., the microprocessor 1100 of FIG. 11, the CPU 1220 of FIG. 12, etc.) in one package, a DSP (e.g., the DSP 1222 of FIG. 12) in another package, a GPU in yet another package, and an FPGA (e.g., the FPGA circuitry 1200 of FIG. 12) in still yet another package.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is to refer to implementations including any of (1) at least one A, (2) at least one B, or (3) at least one A and at least one B. Similarly, as used herein in the context of describing structures, components, items, objects and/or things, the phrase "at least one of A or B" is to refer to implementations including any of (1) at least one A, (2) at least one B, or (3) at least one A and at least one B. As used herein in the context of describing the performance or execution of processes, instructions, actions, activities, etc., the phrase "at least one of A and B" is to refer to implementations including any of (1) at least one A, (2) at least one B, or (3) at least one A and at least one B. Similarly, as used herein in the context of describing the performance or execution of processes, instructions, actions, activities, etc., the phrase "at least one of A or B" is to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is not feasible and/or advantageous.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections. For example, "approximately" and "about" may indicate such dimensions may be within a tolerance range of +/−10% unless otherwise specified herein.

As used herein "substantially real time" refers to occurrence in a near instantaneous manner recognizing there may be real world delays for computing time, transmission, etc. Thus, unless otherwise specified, "substantially real time" refers to real time+1 second.

As used herein, the phrase "in communication," including variations thereof, encompasses direct communication and/or indirect communication through one or more intermediary components, and does not require direct physical (e.g., wired) communication and/or constant communication, but rather also includes selective communication at periodic intervals, scheduled intervals, aperiodic intervals, and/or one-time events.

As used herein, "programmable circuitry" is defined to include (i) one or more special purpose electrical circuits (e.g., an application specific circuit (ASIC)) structured to perform specific operation(s) and including one or more semiconductor-based logic devices (e.g., electrical hardware implemented by one or more transistors), and/or (ii) one or more general purpose semiconductor-based electrical circuits programmable with instructions to perform specific functions(s) and/or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations and/or functions, Field Programmable Gate Arrays (FPGAs) that may be programmed with second instructions to cause configuration and/or structuring of the FPGAs to instantiate one or more operations and/or functions corresponding to the first instructions, Graphics Processor Units (GPUs) that may execute first instructions to perform one or more operations and/or functions, Digital Signal Processors (DSPs) that may execute first instructions to perform one or more operations and/or functions, XPUs, Network Processing Units (NPUs) one or more microcontrollers that may execute first instructions to perform one or more operations and/or functions and/or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and/or any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example an integrated circuit may be implemented as one or more of an ASIC, an FPGA, a chip, a microchip, programmable circuitry, a semiconductor substrate coupling multiple circuit elements, a system on chip (SoC), etc.

From the foregoing, it will be appreciated that example systems, apparatus, articles of manufacture, and methods have been described that implement dithering techniques for ADCs. Described systems, apparatus, articles of manufacture, and methods improve the efficiency of a computing device by reducing or eliminating saturation at the ADC output and the associated output signal distortion, thereby increasing the dynamic range of the ADC and improving SNR. Described systems, apparatus, articles of manufacture, and methods are accordingly directed to one or more improvement(s) in the operation of a machine such as a computer or other electronic and/or mechanical device.

The following claims are hereby incorporated into this Detailed Description by this reference. Although certain example systems, apparatus, articles of manufacture, and methods have been described herein, the scope of coverage of this patent is not limited thereto. On the contrary, this patent covers all systems, apparatus, articles of manufacture, and methods fairly falling within the scope of the claims of this patent.

What is claimed is:

1. An analog-to-digital converter (ADC) comprising:
first ADC circuitry having an input and an output;
second ADC circuitry having an input and an output; and
dither circuitry having a first input coupled to the output of the first ADC circuitry, having a second input coupled to the output of the second ADC circuitry, having a first output coupled to the input of the first ADC circuitry, having a second output coupled to the input of the second ADC circuitry, and having a third output, the dither circuitry configured to:
generate a first dither signal to produce a first dithered input signal at the first output coupled to the input of the first ADC circuitry;
generate a second dither signal to produce a second dithered input signal at the second output coupled to the input of the second ADC circuitry, the first dither signal and the second dither signal to have opposite signs; and
produce an output signal at the third output based on the first output of the first ADC circuitry and the second output of the second ADC circuitry.

2. The ADC of claim 1, wherein the dither circuitry is configured to:
generate the first dither signal based on a first magnitude signal and a first digital sequence;
generate the second dither signal based on a second magnitude signal and a second digital sequence; and
set the first digital sequence to be a negative of the second digital sequence based on a condition.

3. The ADC of claim 2, wherein to produce the output signal at the third output, the dither circuitry is configured to:
determine an adjusted first output signal based on the output of the first ADC circuitry, the first digital sequence and an estimate of the first magnitude signal;
determine an adjusted second output signal based on the output of the second ADC circuitry, the second digital sequence and an estimate of the second magnitude signal;
set the output signal at the third output to the adjusted first output signal when the output of the second ADC circuitry is saturated;
set the output signal at the third output to the adjusted second output signal when the output of the first ADC circuitry is saturated; and
set the output signal at the third output to an average of the adjusted first output signal and the adjusted second output signal when the output of the first ADC circuitry and the output of the second ADC circuitry are not saturated.

4. The ADC of claim 2, wherein to produce the output signal at the third output, the dither circuitry is configured to:
determine an adjusted first output signal based on the output of the first ADC circuitry, the first digital sequence and an estimate of the first magnitude signal;
determine an adjusted second output signal based on the output of the second ADC circuitry, the second digital sequence and an estimate of the second magnitude signal; and set the output signal of the third output to a weighted combination of the adjusted first output signal and the adjusted second output signal.

5. The ADC of claim 4, wherein the dither circuitry is configured to determine the weighted combination of the adjusted first output signal and the adjusted second output signal based on a trapezoidal function.

6. The ADC of claim 1, wherein the dither circuitry is configured to:
generate the first dither signal based on a first magnitude signal and a first digital sequence;
generate the second dither signal based on a second magnitude signal and a second digital sequence, the first digital sequence and the second digital sequence are based on a plurality of possible values;
set a first value of the first digital sequence to be a negative of a corresponding second value of the second digital sequence when the first value and the second value do not equal a particular one of the plurality of possible values;
set the first value of the first digital sequence to a first selected one of the plurality of possible values when the second value of the second digital sequence equals the particular one of the plurality of possible values; and
set the second value of the second digital sequence to a second selected one of the plurality of possible values when the first value of the first digital sequence equals the particular one of the plurality of possible values.

7. The ADC of claim 6, wherein the particular one of the plurality of possible values is a smallest, negative one of the plurality of possible values.

8. The ADC of claim 6, wherein the dither circuitry is configured to:
determine an estimate of the first magnitude signal based on the first digital sequence and a difference between the output of the first ADC circuitry and the output of the second ADC circuitry when the output of the first ADC circuitry and the output of the second ADC circuitry are not saturated and the second digital sequence has a value equal to the particular one of the plurality of possible values; and
determine an estimate of the second magnitude signal based on the second digital sequence and a difference between the output of the second ADC circuitry and the output of the first ADC circuitry when the output of the first ADC circuitry and the output of the second ADC circuitry are not saturated and the first digital sequence has a value equal to the particular one of the plurality of possible values.

9. The ADC of claim 1, wherein the dither circuitry is configured to:
generate the first dither signal based on a plurality of magnitude signals and a corresponding plurality of digital sequences, the digital sequences are based on a plurality of possible values;
detect whether at least one of the output of the first ADC circuitry or the output of the second ADC circuitry is saturated;
set respective values of the digital sequences based on selection from the plurality of possible values when the output of the first ADC circuitry and the output of the second ADC circuitry are not saturated; and
at least one of (i) set a value of at least one of the digital sequences based on a pattern or (ii) reduce at least one of the magnitude signals when the at least one of the output of the first ADC circuitry or the output of the second ADC circuitry is saturated.

10. The ADC of claim 9, wherein the dither circuitry is configured to, after detection that the at least one of the output of the first ADC circuitry or the output of the second ADC circuitry is saturated:
detect a peak value in a frame of samples of the output signal; and
set the respective values of the digital sequences based on the peak value.

11. The ADC of claim 9, wherein the dither circuitry is configured to estimate ones of the magnitude signals corresponding to respective ones of the digital sequences that are set based on the selection from the plurality of possible values.

12. An analog-to-digital converter (ADC) comprising:
first ADC circuitry having an input and an output;
second ADC circuitry having an input and an output; and
dither circuitry including:
first circuitry configured to produce a first dithered input signal at a first output coupled to the input of the first ADC circuitry, and to produce a second dithered input signal at a second output coupled to the input of the second ADC circuitry, the first dithered input signal based on a first dither signal, the second dithered input signal based on a second dither signal having an opposite sign relative to the first dither signal based on a condition;
second circuitry having a first input coupled to the output of the first ADC circuitry, having a second input coupled to the output of the second ADC circuitry, having a first output to provide an adjusted first output signal based on the output of the first ADC circuitry, and having a second output to provide an adjusted second output signal based on the output of the second ADC circuitry; and
third circuitry having a first input coupled to the first output of the second circuitry, having a second input coupled to the second output of the second circuitry, and having an output, the third circuitry configured to provide one of the adjusted first output signal, the adjusted second output signal or a combination of the adjusted first output signal and the adjusted second output signal at the output of the third circuitry.

13. The ADC of claim 12, wherein the third circuitry has a third input, and the dither circuitry includes fourth circuitry having a first input coupled to the output of the first ADC circuitry, having a second input coupled to the output of the second ADC circuitry, and having an output coupled to the third input of the third circuitry, the fourth circuitry configured to provide a control signal at the output of the fourth circuitry, the third circuitry configured to provide one of the adjusted first output signal, the adjusted second output signal or the combination of the adjusted first output signal and the adjusted second output signal at the output of the third circuitry based on the control signal.

14. The ADC of claim 13, wherein the fourth circuitry is configured to generate the control signal to indicate whether at least one of the output of the first ADC circuitry or the output of the second ADC circuitry is saturated, and the third circuitry is configured to:
provide the adjusted first output signal at the output of the third circuitry when the output of the second ADC circuitry is saturated;
provide the adjusted second output signal at the output of the third circuitry when the output of the first ADC circuitry is saturated; and
provide the combination of the adjusted first output signal and the adjusted second output signal at the output of the third circuitry when the output of the second ADC circuitry is not saturated and the output of the first ADC circuitry is not saturated.

15. The ADC of claim 12, wherein the third circuitry has a third input, and the dither circuitry includes fourth circuitry having a first input coupled to the first output of the second circuitry, having a second input coupled to the second output of the second circuitry and having an output coupled to the third input of the third circuitry, the fourth circuitry configured to provide an average of the adjusted first output signal and the adjusted second output signal at the output of the fourth circuitry.

16. An analog-to-digital converter (ADC) comprising:
first ADC circuitry having an input and an output;
second ADC circuitry having an input and an output; and
dither circuitry including:
   first circuitry configured to produce a first dithered input signal at a first output coupled to the input of the first ADC circuitry, and to produce a second dithered input signal at a second output coupled to the input of the second ADC circuitry, the first dithered input signal based on a first dither signal, the second dithered input signal based on a second dither signal having an opposite sign relative to the first dither signal based on a condition;
   second circuitry having a first input coupled to the output of the first ADC circuitry, having a second input coupled to the output of the second ADC circuitry, having a first output to provide an adjusted first output signal based on the output of the first ADC circuitry, and having a second output to provide an adjusted second output signal based on the output of the second ADC circuitry; and
   third circuitry having a first input coupled to the first output of the second circuitry, having a second input coupled to the second output of the second circuitry, and having an output, the third circuitry configured to provide a weighted combination of the adjusted first output signal and the adjusted second output signal at the output of the third circuitry.

17. The ADC of claim 16, wherein the third circuitry is configured to determine the weighted combination as a weighted average of the adjusted first output signal and the adjusted second output signal, the weighted average based on a first weight associated with the adjusted first output signal and a second weight associated with the adjusted second output signal.

18. The ADC of claim 16, wherein the third circuitry has a third input, and the dither circuitry includes fourth circuitry having a first input coupled to the output of the first ADC circuitry, having a second input coupled to the output of the second ADC circuitry, and having an output coupled to the third input of the third circuitry, the fourth circuitry is configured to provide a weight at the output of the fourth circuitry, and the third circuitry is configured to determine the weighted combination of the adjusted first output signal and the adjusted second output signal based on the weight.

19. The ADC of claim 18, wherein the fourth circuitry is configured to determine the weight based on the output of the first ADC circuitry, the output of the second ADC circuitry, and a trapezoidal function.

20. The ADC of claim 18, wherein the third circuitry has a fourth input, the output of the fourth circuitry is a first output of the fourth circuitry, the fourth circuitry has a second output, the weight is a first weight provided at the first output of the fourth circuitry, the fourth circuitry is configured to provide a second weight at the second output of the fourth circuitry, and the third circuitry is configured to determine the weighted combination of the adjusted first output signal and the adjusted second output signal based on the first weight and the second weight.

21. The ADC of claim 20, wherein the fourth circuitry is to subtract the first weight from one to determine the second weight.

22. An analog-to-digital converter (ADC) comprising:
first ADC circuitry having an input and an output;
second ADC circuitry having an input and an output; and
dither circuitry including:
   first circuitry having a first output, a second output, and an input, the first circuitry configured to provide a first dither signal at the first output and to provide a second dither signal at the second output, the first circuitry configured to generate the first dither signal and the second dither signal to have opposite signs based on a plurality of magnitude signals and a plurality of digital sequences;
   second circuitry having a first input coupled to the first output of the first circuitry, and having a second input coupled to the second output of the first circuitry, the second circuitry configured to produce a first dithered input signal at a first output coupled to the input of the first ADC circuitry, and to produce second dithered input signal at a second output coupled to the input of the second ADC circuitry, the first dithered input signal based on the first dither signal, the second dithered input signal based on the second dither signal; and
   third circuitry having an input, and having an output coupled to the input of the first circuitry, the third circuitry configured to determine a control signal based on a signal applied to the input, the third circuitry configured to output the control signal at the output, wherein the first circuitry is configured to set one or more values of the plurality of digital sequences based on the control signal.

23. The ADC of claim 22, wherein the third circuitry is configured to:
detect a peak of a frame of samples of the signal applied to the input of the third circuitry; and
set the control signal based on comparison of the peak to a threshold.

24. The ADC of claim 23, wherein the dither circuitry includes fourth circuitry having a first input coupled to the output of the first ADC circuitry, and having a second input coupled to the output of the second ADC circuitry, the fourth circuitry is configured to determine whether at least one of the output of the first ADC circuitry or the output of the second ADC circuitry is saturated, the third circuitry is configured to determine the frame of samples based on a counter, and the third circuitry is to reset the counter based on a determination that the at least one of the output of the first ADC circuitry or the output of the second ADC circuitry is saturated.

25. The ADC of claim 22, wherein the dither circuitry includes fourth circuitry having a first input coupled to the output of the first ADC circuitry, and having a second input coupled to the output of the second ADC circuitry, the fourth circuitry is configured to determine whether at least one of the output of the first ADC circuitry or the output of the second ADC circuitry is saturated, and the first circuitry is configured to set one or more values of the plurality of digital sequences based on a pattern in response to a determination that the at least one of the output of the first ADC circuitry or the output of the second ADC circuitry is saturated.

\* \* \* \* \*